(12) United States Patent
Caprara et al.

(10) Patent No.: US 11,473,756 B2
(45) Date of Patent: Oct. 18, 2022

(54) LIGHT EMITTING DEVICE WITH ADAPTABLE GLARE CLASS

(71) Applicant: Schreder S.A., Brussels (BE)

(72) Inventors: Roxane Caprara, Neupre (BE); Paul Smets, Liege (BE); Maxime Dietens, Liege (BE); Vincent Lang, Grace-Hollogne (BE)

(73) Assignee: Schreder S.A., Brussels (BE)

( * ) Notice: Subject to any disclaimer, the term of this patent is extended or adjusted under 35 U.S.C. 154(b) by 0 days.

(21) Appl. No.: 17/278,174

(22) PCT Filed: Sep. 17, 2019

(86) PCT No.: PCT/EP2019/074894
§ 371 (c)(1),
(2) Date: Mar. 19, 2021

(87) PCT Pub. No.: WO2020/058282
PCT Pub. Date: Mar. 26, 2020

(65) Prior Publication Data
US 2022/0034481 A1 Feb. 3, 2022

(30) Foreign Application Priority Data

Sep. 20, 2018 (NL) .................................. 2021671
Jun. 12, 2019 (NL) .................................. 2023296

(51) Int. Cl.
*F21V 13/04* (2006.01)
*F21V 5/00* (2018.01)
(Continued)

(52) U.S. Cl.
CPC .............. *F21V 13/04* (2013.01); *F21V 5/007* (2013.01); *F21V 7/04* (2013.01); *F21V 7/22* (2013.01);
(Continued)

(58) Field of Classification Search
CPC . F21V 13/04; F21V 5/007; F21V 7/04; F21V 7/22; F21V 17/00; F21V 5/08; F21Y 2115/10; H01L 25/0753
See application file for complete search history.

(56) References Cited

U.S. PATENT DOCUMENTS 9,903,561 B1 2/2018 Chen et al.
2010/0207131 A1 8/2010 Chiang et al.
(Continued)

FOREIGN PATENT DOCUMENTS

| AU | 2008200821 A1 | 4/2009 |
|---|---|---|
| EP | 3211297 A1 | 8/2017 |
| KR | 101468311 B1 | 12/2014 |

OTHER PUBLICATIONS

PCT International Search Report and Written Opinion, Application No. PCT/EP2019/074894, dated Oct. 25, 2019, 11 pages.

*Primary Examiner* — Tracie Y Green
(74) *Attorney, Agent, or Firm* — McDonnell Boehnen Hulbert & Berghoff LLP

(57) ABSTRACT

Example embodiments relate to light emitting devices with adaptable glare classes. One embodiment includes a light emitting device. The light emitting device includes a carrier. The light emitting device also includes a plurality of light sources disposed on the carrier. Additionally, the light emitting device includes a lens plate disposed on the carrier. The lens plate includes a flat portion and a plurality of lenses covering the plurality of light sources. Further, the light emitting device includes a light shielding structure that includes a plurality of reflective barriers, each including a base surface disposed on the flat portion, a top edge at a height above the base surface, and a first reflective sloping surface connecting the base surface and the top edge. The (Continued)

first reflective sloping surface is configured for reflecting light rays emitted through one or more associated first lenses of the plurality of lenses.

20 Claims, 11 Drawing Sheets

(51) Int. Cl.
*F21V 17/00* (2006.01)
*F21V 7/04* (2006.01)
*F21V 7/22* (2018.01)
*F21Y 115/10* (2016.01)
*H01L 25/075* (2006.01)

(52) U.S. Cl.
CPC ........... *F21V 17/00* (2013.01); *F21Y 2115/10* (2016.08); *H01L 25/0753* (2013.01)

(56) References Cited

U.S. PATENT DOCUMENTS

| | | |
|---|---|---|
| 2011/0292658 A1 | 12/2011 | Ho |
| 2014/0063802 A1 | 3/2014 | Garcia |
| 2021/0399042 A1* | 12/2021 | Li ........................... H01L 33/10 |
| 2022/0045250 A1* | 2/2022 | Shimizu .............. H01L 25/0753 |
| 2022/0057071 A1* | 2/2022 | Smets ..................... F21V 14/06 |
| 2022/0057072 A1* | 2/2022 | Smets ..................... F21V 17/02 |

* cited by examiner

LIGHT EMITTING DEVICE WITH ADAPTABLE GLARE CLASS

CROSS-REFERENCE TO RELATED APPLICATIONS

The present application is a national stage entry of PCT/EP2019/074894 filed Sep. 17, 2019, which claims priority to NL 2021671 filed Sep. 20, 2018 and NL 2023296 filed Jun. 12, 2019, the contents of each of which are hereby incorporated by reference.

FIELD OF INVENTION

The present invention relates to a light emitting device, and more particularly, to a light emitting device with an improved G/G* classification.

BACKGROUND

Optical elements, such as light emitting diodes (LEDs) and lenses, comprised in standard light emitting devices may emit light at large angles. In the designs of conventional light emitting devices, such as LED devices, the light rays generated by the light source may have large angles below the horizontal, and thus may result in glare that would cause discomfort for the user.

Therefore, light emitting devices, in particular outdoor luminaires, must comply with different glare classifications, usually abbreviated G or G* classifications. The G classification is defined in the CIE115:2010 standard, whereas the G* classification is defined by the EN 13201-2 standard. Such classifications are based on the maximal allowed ratio between the light intensity and the light flux at large angles below the horizontal, such ratio being generally expressed in cd/klm. The lowest G/G* classification, or G1/G*1 class, corresponds to the glariest situation for the user, causing the highest discomfort, whereas the highest G/G* classification, or G6/G*6 class, corresponds to the most comfortable situation for the user.

In order to reduce light intensities at large angles and improve the G/G* classification of a light emitting device, improved optical elements can be developed and manufactured. While the above mentioned goal can be achieved, manufacturing such optical elements can be time consuming and expensive, requiring large investment costs for replacing the existing optical elements on the light emitting devices. Moreover, in order to adapt the G/G* classification of a light emitting device, different types of optical elements are required, each given type corresponding to a given G/G* classification. Finally, for each type of optical elements corresponding to each G/G* classification, additional categories of optical elements may be required depending on the road type, e.g. depending on the width of a road (residential road, traffic route, highway, pedestrian path, etc.), or depending on its location (inside a city, in the countryside, etc.). This has the effect of increasing the amount of different optical elements to be manufactured in order to answer every need from the customers. This solution may involve high development, manufacturing, and maintenance costs.

SUMMARY

The object of embodiments of the invention is to provide a light emitting device comprising a light shielding structure. More in particular, embodiments of the invention aim at providing a light emitting device comprising a light shielding structure configured for cutting off or reflecting light rays having a large incident angle, thereby reducing the light intensities at large angles and improving the G/G* classification of the light emitting device.

According to a first aspect of the invention, there is provided a light emitting device comprising a carrier, a plurality of light sources disposed on the carrier, a lens plate disposed on the carrier, and a light shielding structure. The lens plate comprises a flat portion and a plurality of lenses covering the plurality of light sources. The light shielding structure comprises a plurality of reflective barriers, each comprising a base surface disposed on said flat portion, a top edge at a height above said base surface, and a first reflective sloping surface connecting the base surface and the top edge and facing one or more associated lenses of said plurality of lenses. The first reflective sloping surface is configured for reflecting light rays emitted through one or more associated first lenses of said plurality of lenses having a first incident angle with respect to an axis substantially perpendicular to the base surface between a first predetermined angle and 90°, with a first reflection angle with respect to said axis smaller than 60°. The first predetermined value is a value below 90°. In other words, when the first incident angle is between the first predetermined value and 90°, the first reflective sloping surface reflects the incident ray such that the reflected ray (or the main reflection direction of the reflected rays, defined as the direction of highest intensity in an event where the first reflective sloping surface is such that it reflects the incident ray in different directions, e.g. in case of surface with a certain roughness) has a reflection angle with respect to said axis smaller than 60°.

Embodiments of the invention are based inter alia on the insight that light emitting devices generally incorporate optical elements which are costly, of complex design, and can be the cause of delays in the fabrication line. To overcome the problem of manufacturing different types of optical elements according to different G/G* classifications a light emitting device must comply with, a light emitting device comprising a light shielding structure as defined above can be used, resulting in a cheaper solution whilst being able to achieve a high G/G* classification. Moreover, with the light emitting device as defined above, it is also possible to easily achieve various G/G* classifications with a given optical element, e.g. by varying the number and/or height and/or shape of reflective barriers.

The light shielding structure may be a separate component mounted on the lens plate, or may be integrally formed with the lens plate, e.g. by overmoulding.

The first reflective sloping surface of each reflective barrier comprised in the light shielding structure is configured for reflecting light rays having a large incident angle with respect to an axis substantially perpendicular to the lens plate/base surface. Since the reflection angle with respect to said axis is smaller than 60°, the light shielding structure as defined above enables a reduction of the light intensities at large angles, thereby improving the G/G* classification of the light emitting device.

Preferred embodiments relate to a light shielding structure for use in an outdoor luminaire. By outdoor luminaire, it is meant luminaires which are installed on roads, tunnels, industrial plants, campuses, parks, cycle paths, pedestrian paths or in pedestrian zones, for example, and which can be used notably for the lighting of an outdoor area such as roads and residential areas in the public domain, private parking areas and access roads to private building infrastructures, etc.

In a preferred embodiment, the first predetermined angle is comprised between 60° and 85°, preferably between 70° and 80°. The first reflection angle is preferably comprised between 0° and 50°, preferably between 0° and 45°.

The above-mentioned axis may be a first axis intersecting said one or more associated first lenses of said plurality of lenses substantially perpendicular to the base surface. The first axis may correspond to the optical axis of said one or more associated first lenses. The first incident angle with respect to said first axis may be between the first predetermined angle and 90°. A second axis may be parallel to said first axis and may intersect the first reflective sloping surface at the reflection point of an incident light ray emitted through said one or more associated first lenses at the first incident angle. The first reflection angle with respect to said second axis may be smaller than 60°. Reflected light rays having said first reflection angle may intersect said first axis.

The above-mentioned range for the first predetermined angle enables the selection of large incident angles that correspond to glaring angles. Since the first reflective sloping surface is configured such that the first reflection angle is smaller than the first incident angle with respect to said axis, the light shielding structure enables to avoid that a backward incident light ray having a large incident angle with respect to said axis be reflected with a reflection angle substantially equal to the incident angle, thereby avoiding that a reflected light ray may have a glaring angle for a user.

In a preferred embodiment, the first reflective sloping surface comprises any one of a concave surface, a convex surface, a flat surface, or a combination thereof.

In this manner, the shape of the first reflective surface is not limited to a flat surface. The use of concave and/or convex shapes enables to achieve that the first reflection angle be smaller than the first incident angle with respect to said axis, thereby avoiding the above-mentioned undesired effect related to reflected backward incident light ray having a large angle. In exemplary embodiments, the use of a flat surface which is substantially not perpendicular to the flat portion of the lens plate may enable to achieve the same or similar results. Indeed, a flat surface substantially perpendicular to the flat portion of the lens plate would reflect backward incident light ray having a large incident angle with a reflection angle substantially equal to the incident angle, thereby creating a reflected ray having a glaring angle, causing discomfort for the user.

In a preferred embodiment, a surface roughness of the first reflective sloping surface corresponds to any one of a coarse surface finish, a polished surface finish, or a combination thereof. The surface roughness may be the same for the first reflective sloping surface of each reflective barrier, or may be different from one reflective barrier to another.

In a preferred embodiment, the plurality of lenses is a plurality of non-rotation symmetric lenses comprising a symmetry plane substantially perpendicular to the flat portion, and substantially parallel to the top edge of the plurality of reflective barriers. The symmetry plane may be a single symmetry plane.

In an embodiment, one or more other optical elements may be provided to the lens plate, such as reflectors, backlights, prisms, collimators, diffusors, and the like. For example, there may be associated a backlight element with some lenses or with each lens of the plurality of lenses. Those one or more other optical elements may be formed integrally with the lens plate. In other embodiments, those one or more other optical elements may be formed integrally with the light shielding structure, and/or mounted on the lens plate and/or on the light shielding structure via releasable fastening elements. In the context of the invention, a lens may include any transmissive optical element that focuses or disperses light by means of refraction. It may also include any one of the following: a reflective portion, a backlight portion, a prismatic portion, a collimator portion, a diffusor portion. For example, a lens may have a lens portion with a concave or convex surface facing a light source, or more generally a lens portion with a flat or curved surface facing the light source, and optionally a collimator portion integrally formed with said lens portion, said collimator portion being configured for collimating light transmitted through said lens portion. Also, a lens may be provided with a reflective portion or surface, referred to as a backlight element in the context of the invention, or with a diffusive portion.

A lens of the plurality of lenses may comprise a lens portion having an outer surface and an inner surface facing the associated light source. The outer surface may be a convex surface and the inner surface may be a concave or planar surface. Also, a lens may comprise multiple lens portions adjoined in a discontinuous manner, wherein each lens portion may have a convex outer surface and a concave inner surface.

Hence, lenses that can be used in combination with the light shielding structure are not limited to rotation-symmetric lenses such as hemispherical lenses, or to ellipsoidal lenses having a major symmetry plane and a minor symmetry plane, although such rotation-symmetric lenses could be used. Alternatively, lenses with no symmetry plane or symmetry axis could be envisaged.

In an exemplary embodiment, also an edge of the base surface of the plurality of reflective barriers is substantially parallel to said symmetry plane.

In other words, the first reflective sloping surface faces one or more associated first lenses of said plurality of lenses, and is facing the symmetry plane of said one or more associated first lenses. In light emitting devices using freeform lenses, such as outdoor luminaires, the lens plate is disposed such that the symmetry plane of said lenses is substantially perpendicular to the motion direction of a road, tunnel, or path, in order to have substantially the same illumination distribution on both motion directions of the road, tunnel, or path. Hence, arranging the first reflective sloping surface substantially perpendicular to the motion direction of e.g. a road enables to cut off or reflect light rays having a large incident angle in the motion direction of said road, thereby improving the comfort of a user.

In a preferred embodiment, at least one reflective barrier of the plurality of reflective barriers further comprises a second reflective sloping surface opposite the first reflective sloping surface, configured for reflecting light rays emitted through one or more associated second lenses of said plurality of lenses adjacent to the one ore more first lenses associated with the first reflective sloping surface, having a second incident angle with respect to an axis substantially perpendicular to the base surface comprised between a second predetermined angle and 90°, with a second reflection angle with respect to said axis smaller than 60°.

In the same way the first reflective sloping surface of said plurality of reflective barriers is configured for reflecting light rays emitted through one or more associated first lenses of said plurality of lenses, the second reflective sloping surface of said plurality of reflective barriers is configured for reflecting light rays emitted through one or more associated second lenses of said plurality of lenses. The one or more second lenses are arranged adjacent to the one or more first lenses. This arrangement implies that the second reflective sloping surface is arranged opposite the first reflective sloping surface. The configuration of the second reflective sloping surface may be, but does not need to be, the same as the one of the first reflecting sloping surface, in order to achieve the same or similar results with respect to cutting off or reflecting light rays having a large incident angle, i.e., in order that light rays emitted through said one or more second lenses associated with the second reflective sloping surface, having a second incident angle with respect to an axis substantially perpendicular to the base surface comprised between a second predetermined angle and 90°, be reflected with a second reflection angle with respect to said axis smaller than 60°.

In a preferred embodiment, the second predetermined angle is comprised between 60° and 85°, preferably between 70° and 80°. The second reflection angle is preferably comprised between 0° and 50°, preferably between 0° and 45°.

The above-mentioned axis may be a third axis intersecting said one or more associated second lenses of said plurality of lenses substantially perpendicular to the base surface. The third axis may correspond to the optical axis of said one or more associated second lenses. The second incident angle with respect to said third axis may be between the second predetermined angle and 90°. A fourth axis may be parallel to said third axis and may intersect the second reflective sloping surface at the reflection point of an incident light ray emitted through said one or more associated second lenses at the second incident angle. The second reflection angle with respect to said fourth axis may be smaller than 60°. Reflected light rays having said second reflection angle may intersect said third axis.

In an exemplary embodiment, an edge of the base surface delimiting the second reflective sloping surface is substantially parallel to a symmetry plane of the one or more associated second lenses.

In a preferred embodiment, the second reflective sloping surface comprises any one of a concave surface, a convex surface, a flat surface, or a combination thereof.

In a preferred embodiment, a surface roughness of the second reflective sloping surface corresponds to any one of a coarse surface finish, a polished surface finish, or a combination thereof. The surface roughness may be the same for the second reflective sloping surface of each reflective barrier, or may be different from one reflective barrier to another.

In a preferred embodiment, the first reflective sloping surface and the second reflective sloping surface of the at least one of the plurality of reflective barriers are symmetric with respect to a plane substantially perpendicular to the flat portion, and preferably at equal distance from the one or more first lenses and the one ore more second lenses. In other embodiments, the first reflective sloping surface and the second reflective sloping surface of the at least one of the plurality of reflective barriers may not be symmetric with respect to said plane and/or may not be at equal distance from the one or more first lenses and the one ore more second lenses.

A symmetric arrangement of the first and second reflective sloping surfaces with respect to said plane facilitates the design and manufacture of the plurality of reflective barriers. Together with the arrangement of the first and second reflective sloping surfaces at equal distance from the one or more first lenses and the one or more second lenses, this arrangement may enable to achieve the same or similar results with respect to cutting off or reflecting light rays having a large incident angle from both one or more first lenses and one ore more second lenses. The two above-mentioned arrangements enable to obtain homogeneous results between the first lenses and the second lenses.

In an embodiment, the reflective barriers facing associated lenses located in a central portion of the lens plate are substantially higher than the reflective barriers facing associated lenses located in a peripheral portion of the lens plate. Alternatively, said reflective barriers facing said associated lenses located in said central portion of the lens plate may be substantially lower than reflective barriers facing said associated lenses located in said peripheral portion of the lens plate. Preferably, the first reflective sloping surface and the second reflective sloping surface of the above-mentioned reflective barriers are symmetric with respect to a plane substantially perpendicular to the flat portion and at equal distance from the one or more first lenses and the one ore more second lenses.

In an exemplary embodiment, the light shielding structure comprises at least one further reflective barrier arranged at an angle with respect to the flat portion and at an angle with respect to the plurality of reflective barriers. Preferably, the at least one further reflective barrier is arranged substantially perpendicular to the flat portion. Preferably, the at least one further reflective barrier is arranged substantially perpendicular to the plurality of reflective barriers.

In a preferred embodiment, the plurality of lenses is aligned into a plurality of rows and a plurality of columns to form a two-dimensional array of lenses. At least one reflective barrier of the plurality of reflective barriers is disposed between two adjacent columns. Similarly, in a preferred embodiment the plurality of reflective barriers is aligned into a plurality of rows or a plurality of columns. In an exemplary embodiment, the at least one further reflective barrier is disposed between two adjacent rows of lenses A lens plate comprising a two-dimensional array formed by rows and columns of lenses is typically found in light emitting devices such as outdoor luminaires.

In an exemplary embodiment, said plurality of columns of lenses is formed along the symmetry plane.

This embodiment is in accordance with an embodiment wherein the top edge of the plurality of reflective barriers is substantially parallel to the symmetry plane of the plurality of lenses. The plurality of lenses is aligned into a plurality of columns along their symmetry plane.

In a preferred embodiment, the first reflective sloping surface of the at least one reflective barrier of the plurality of reflective barriers is facing one or more associated lenses of the plurality of lenses belonging to a first column of said plurality of columns. The second reflective sloping surface of the at least one reflective barrier of the plurality of reflective barriers is facing one or more associated lenses of the plurality of lenses belonging to a second column which is adjacent to said first column.

In the embodiment where the reflective barriers facing associated lenses located in a central portion of the lens plate are substantially higher (lower) than the reflective barriers facing associated lenses located in a peripheral portion of the lens plate, said reflective barriers facing said associated lenses located in said central portion of the lens plate may be disposed between two adjacent central columns of lenses, and said reflective barriers facing said associated lenses located in said peripheral portion of the lens plate may be disposed between two adjacent peripheral columns of lenses.

In a preferred embodiment, the light shielding structure further comprises a connecting means, preferably disposed on said flat portion, configured for connecting the plurality of reflective barriers.

In this manner, by connecting the plurality of reflective barriers the connecting means offers more rigidity to the light shielding structure. Moreover, the connecting means facilitates the mounting of the light shielding structure on the lens plate.

In an exemplary embodiment, the connecting means is disposed between two adjacent rows of said plurality of rows of lenses.

This embodiment is in accordance with an embodiment wherein at least one reflective barrier of the plurality of reflective barriers is disposed between two adjacent columns of said plurality of columns, thereby creating another two-dimensional array that cooperates with the two-dimensional array formed by the plurality of rows and columns of lenses.

In an exemplary embodiment, the connecting means comprises one or more notches or channels into which the plurality of reflective barriers is received.

In an exemplary embodiment, the connecting means comprises at least one elongated carrier slat, said at least one elongated carrier slat comprising an elongated channel configured for receiving a reflective barrier of the at least one further reflective barrier.

Alternatively, the connecting means may comprise one or more notches or channels into which the at least one further reflective barrier is received, and the connecting means may comprise at least one elongated carrier slat, said at least one elongated carrier slat comprising an elongated channel configured for receiving a reflective barrier of the plurality of reflective barriers.

In this way, the plurality of reflective barriers and/or the at least one further reflective barrier may be slid in a portion of the light shielding structure. To that end, the base surface of the plurality of reflective barriers and/or of the at least one further reflective barrier may be provided with one or more protrusions, e.g. one or more pins and/or ribs, which fit in the one or more notches or channels and/or in the at least one elongated carrier slat. Alternatively, one or more protrusions, such as pins or ribs, may be provided to the connecting means, said one or more protrusions being configured for cooperating with complementary features of the plurality of reflective barriers and/or of the at least one further reflective barrier, in order to secure the plurality of reflective barriers and/or the at least one further reflective barrier to the connecting means.

In another exemplary embodiment, one or more recesses, such as one or more holes and/or notches, may be arranged in the light shielding structure, into which the plurality of reflective barriers and/or the at least one further reflective barrier may be clipped. To that end, the base surface of the plurality of reflective barriers and/or of the at least one further reflective barrier may be provided with one or more protrusions, e.g. one or more pins and/or ribs, which fit in the one or more recesses. For example, the one or more notches may have a V-shape or a U-shape, and the one or more protrusions may have a triangular or a circular shape which respectively fits in the V-shape or in the U-shape of the one or more notches. The one or more recesses may be provided to the connecting means or to the lens plate. In addition or alternatively, one or more protrusions, such as pins or ribs, may be provided to the connecting means or to the lens plate, said one or more protrusions being configured for cooperating with complementary features of the plurality of reflective barriers and/or of the at least one further reflective barrier in order to secure the plurality of reflective barriers to the connecting means.

In another exemplary embodiment, the plurality of reflective barriers and the connecting means are integrally formed. Additionally or alternatively, the at least one further reflective barrier and the connecting means may be integrally formed. Additionally or alternatively, the lens plate and the connecting means may be integrally formed.

In this way, the design and the manufacture of the light shielding structure are facilitated, especially when the light shielding structure is molded. The rigidity and mechanical resistance of the entire structure are also improved. Moreover, the mounting of the light shielding structure on the lens plate is facilitated.

In an exemplary embodiment, the height of the plurality of reflective barriers is substantially larger than a height of the connecting means.

Indeed, as the aim of the connecting means is to connect the plurality of reflective barriers, it does not require a minimal height, unlike the plurality of reflective barriers which have to reflect light rays having a large incident angle. Therefore, the height of the plurality of reflective barriers may be substantially larger than the height of the connecting means.

In an exemplary embodiment, the height of the at least one further reflective barrier is substantially larger than a height of the connecting means.

In an exemplary embodiment, the height of the plurality of reflective barriers and/or of the at least one further reflective barrier is between 30% and 150% of a height of the plurality of lenses, preferably between 60% and 120%, most preferably between 70% and 110%. In another exemplary embodiment, the height of the plurality of reflective barriers and/or of the at least one further reflective barrier may be larger than a height of the plurality of lenses, preferably larger than 110% of said height. The height of the lens corresponds to the distance between a plane including the upper surface of the flat portion and the highest point of a lens. Preferably, the distance between two adjacent light sources is smaller than 60 mm, more preferably smaller than 50 mm, most preferably smaller than 40 mm. Typically the distance between two adjacent light sources will be larger than 20 mm. Preferably, the height of the plurality of reflective barriers and/or of the at least one further reflective barrier is smaller than 10 mm, more preferably smaller than 8 mm, most preferably smaller than 7 mm, or even smaller than 6 mm.

This range of heights enables the plurality of reflective barriers to efficiently cut off or reflect light rays having a large incident angle, thereby enabling to efficiently adapt the G/G* classification of the light emitting device.

In an exemplary embodiment, the height of the plurality of reflective barriers is substantially larger than a width of the base surface. Additionally or alternatively, the height of the at least one further reflective barrier is substantially larger than a width of the base surface of said at least one further reflective barrier.

In an exemplary embodiment, a material of the light shielding structure comprises plastic, preferably a plastic with good reflective properties, e.g. a white plastic. Preferably, the plastic used for manufacturing the light shielding structure is a white and opaque plastic, but plastic of a different color and/or partially translucent plastic may be envisaged. The light shielding structure may also comprise other materials than plastic. The light shielding structure is optionally covered with reflective painting or with a reflective coating.

Plastic is a light, cheap, and easy to mold material. It also offers rigidity and mechanical resistance to the light shielding structure.

In a preferred embodiment, the light shielding structure is mounted on the lens plate by means of releasable fastening elements. In another embodiment, the light shielding structure and the lens plate may be formed in one piece. For example, the light shielding structure may be formed by overmoulding.

A further reduction of the light intensities at large angles can be realized by providing additional reflective barriers to the lens plate. Alternatively, it is possible to vary the height of one or more reflective barriers, or to vary the number and/or the height and/or the shape of the reflective barriers in order to adapt the light intensities of the light emitting device at large angles.

In an exemplary embodiment, the releasable fastening elements comprise any one or more than the following elements: screws, locks, clamps, clips, or a combination thereof.

In an exemplary embodiment, the releasable fastening elements are located at intersections of the plurality of reflective barriers with the connecting means.

In an exemplary embodiment, the connecting means is provided with holes, and the releasable fastening elements are located into said holes. Optionally, the lens plate is provided with holes for fixation to the carrier. The carrier may comprise a printed circuit board (PCB).

In this manner, the rigidity and the respective functionalities of both the reflective barriers and the connecting means are not altered significantly by the presence of the releasable fastening elements.

In a possible embodiment, one or more recesses, such as one or more holes and/or channels, may be arranged in the lens plate, into which the light shielding structure may be clipped or slid. To that end, the base surface of the light shielding structure may be provided with one or more protrusions, e.g. one or more pins and/or ribs, which fit in the one or more recesses. In addition or alternatively, one or more protrusions, such as pins or ribs, may be provided to the lens plate, said one or more protrusions being configured for cooperating with complementary features of the light shielding structure in order to secure the light shielding structure to the lens plate.

In yet another exemplary embodiment, the light shielding structure is integrally formed with the lens plate.

In a preferred embodiment, the lens plate is disposed on the carrier by screwing, locking, clamping, clipping, gluing, or a combination thereof.

Screwing, locking, clamping, clipping, and the like correspond to releasable fastening means, thereby enabling the maintenance or the replacement of the lens plate and/or of the carrier.

It is noted that the same fastening means may fasten the light shielding structure to the lens plate and the lens plate to the carrier, e.g. a screw passing through the light shielding structure and through the lens plate and being screwed in the carrier.

In a preferred embodiment, the plurality of light sources comprises light emitting diodes (LEDs).

LEDs have numerous advantages such as long service life, small volume, high shock resistance, low heat output, and low power consumption.

In an exemplary embodiment, the plurality of lenses comprises free-form lenses. The term "free-form" typically refers to non-rotational symmetric lenses.

According to a second aspect of the invention, there is provided a light shielding structure for use in a light emitting device according to the first aspect of the invention, said light shielding structure comprising a plurality of reflective barriers, each comprising a base surface, a top edge at a height above said base surface, and a first reflective sloping surface connecting the base surface and the top edge. The first reflective sloping surface is configured for reflecting light rays emitted at a first incident angle with respect to an axis substantially perpendicular to the base surface comprised between a first predetermined angle and 90°, with a first reflection angle with respect to said axis smaller than 60°.

Preferred features of the light shielding structure disclosed above in connection with the light emitting device may also be used in embodiments of the light shielding structure of the invention.

BRIEF DESCRIPTION OF THE FIGURES

This and other aspects of the present invention will now be described in more detail, with reference to the appended drawings showing a currently preferred embodiment of the invention. Like numbers refer to like features throughout the drawings.

DESCRIPTION OF EMBODIMENTS

Figure 1A:
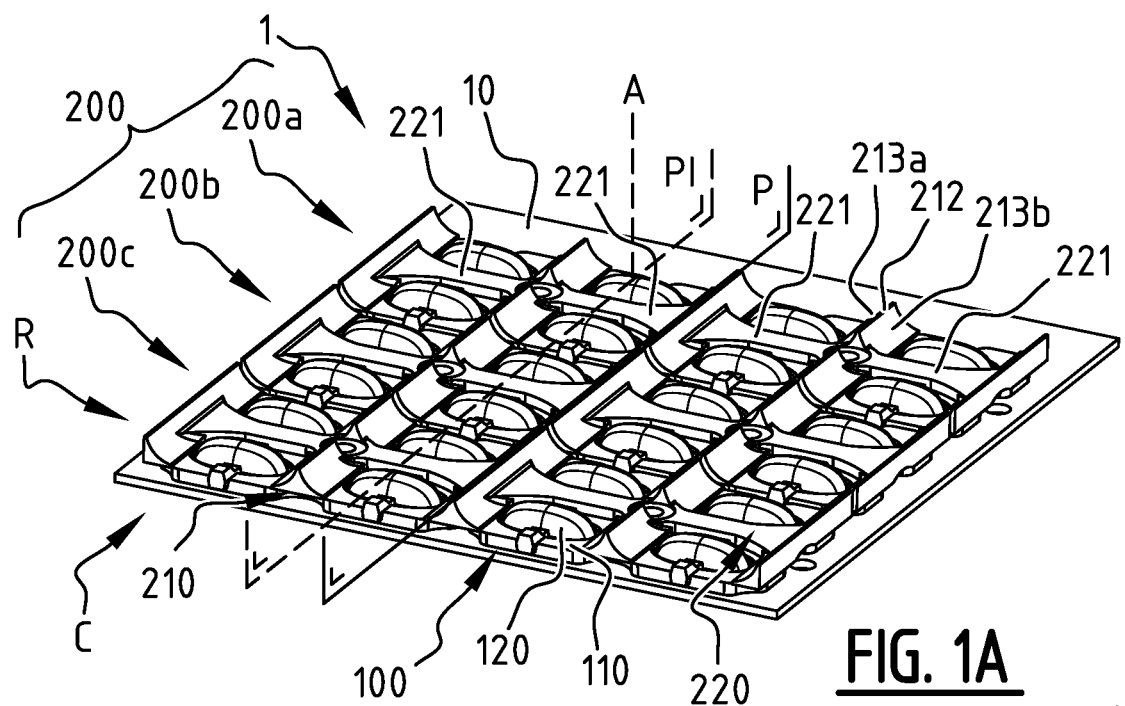
FIGS. 1A-1C respectively show a perspective view of an exemplary embodiment of a light emitting device, an enlarged perspective view thereof, and an enlarged longitudinal view thereof.
Figure 1B:
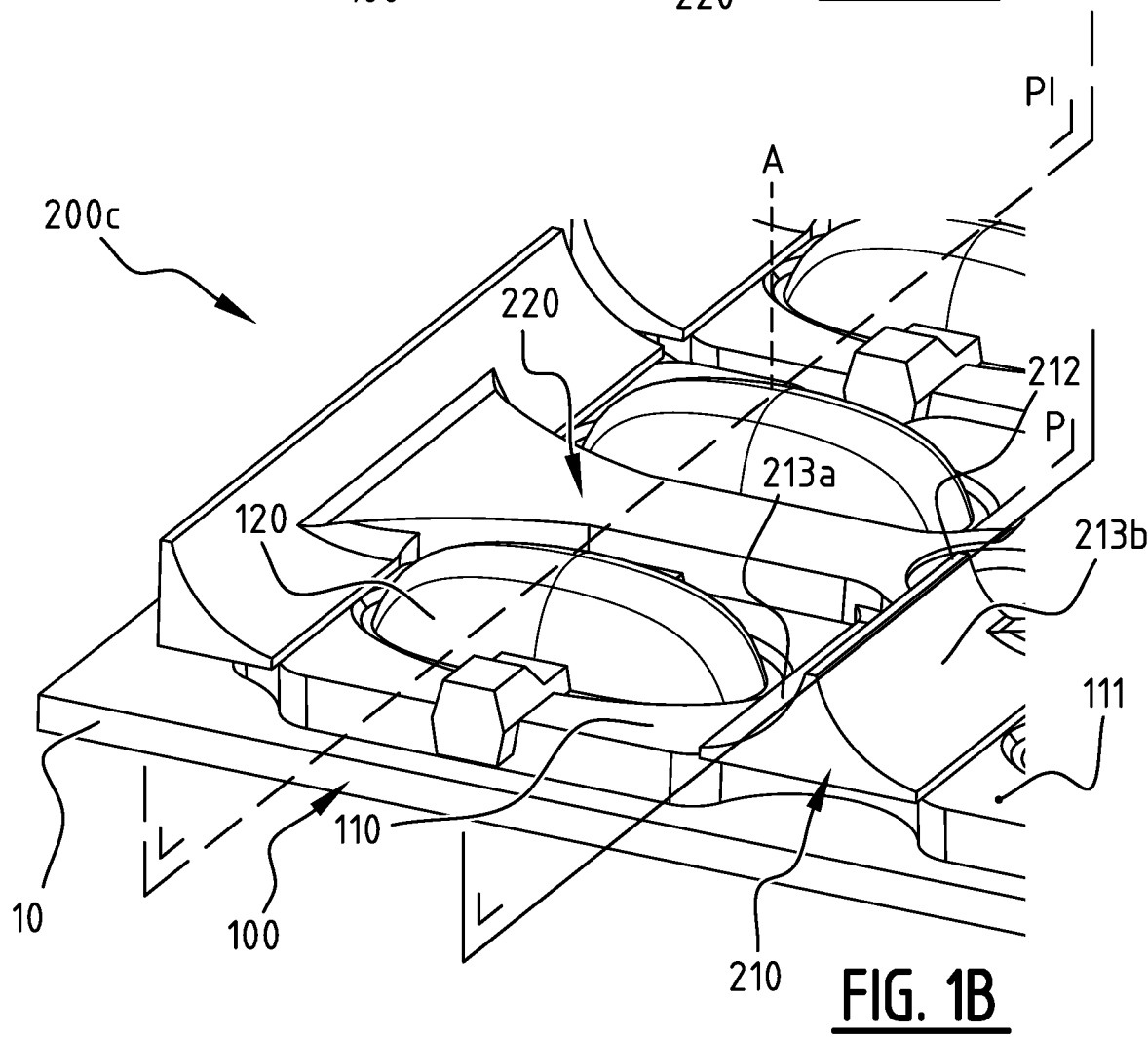
Figure 1C:
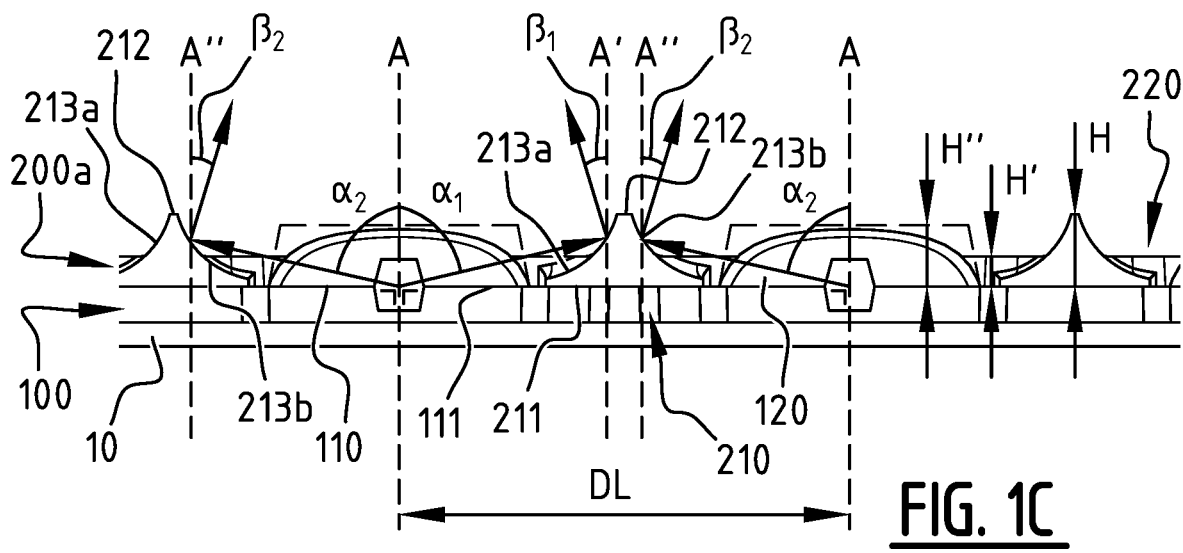

FIGS. 1A-1C respectively show a perspective view of an exemplary embodiment of a light emitting device, an enlarged perspective view thereof, and an enlarged longitudinal view thereof.

As illustrated in the embodiments of FIGS. 1A-1C, the light emitting device 1 comprises a carrier 10, a plurality of light sources disposed on the carrier 10, a lens plate 100 disposed on the carrier 10, and a light shielding structure 200 mounted on said lens plate 100. The lens plate 100 comprises a flat portion 110 and a plurality of lenses 120 covering the plurality of light sources (not shown, but located underneath lenses 120 in a way known to a person skilled in the art). The light shielding structure 200 comprises a plurality of reflective barriers 210, each comprising a base surface 211 disposed on said flat portion 110, a top edge 212 at a height H above said base surface 211, and a first reflective sloping surface 213a connecting the base surface 211 and the top edge 212 and facing one or more associated lenses of said plurality of lenses 120. The plurality of lenses 120 may be non-rotational symmetric lenses 120 comprising a symmetry plane Pl substantially perpendicular to the flat portion 110, and substantially parallel to the top edge 212 of the plurality of reflective barriers 210. Also an edge of the base surface 211 of the plurality of reflective barriers 210 may be substantially parallel to said symmetry plane Pl. The lens plate 100 may be disposed on the carrier 10 by screwing, locking, clamping, clipping, or a combination thereof. The plurality of light sources may comprise light emitting diodes (LEDs). The height H of the plurality of reflective barriers 210 may be between 30% and 150% of a height H" of the plurality of lenses 120, preferably between 60% and 120%, most preferably between 70% and 110%. In another exemplary embodiment, the height H of the plurality of reflective barriers 210 may be larger than a height H" of the plurality of lenses 120, preferably larger than 110% of said height H". The height H" of a lens 120 corresponds to the distance between a plane including the upper surface 111 of the flat portion 110 and the highest point of a lens 120. Preferably, the distance DL between two adjacent light sources is smaller than 60 mm, more preferably smaller than 50 mm, most preferably smaller than 40 mm. Typically the distance between two adjacent light sources will be larger than 20 mm. Preferably, the height of the plurality of reflective barriers is smaller than 10 mm, more preferably smaller than 8 mm, most preferably smaller than 7 mm, or even smaller than 6 mm.

As illustrated in the embodiment of FIG. 1C, said first reflective sloping surface 213a is configured for reflecting light rays emitted through one or more associated first lenses of said plurality of lenses 120 having a first incident angle $\alpha 1$ with respect to an axis A; A', A" substantially perpendicular to the base surface 211 comprised between a first predetermined angle $\alpha p1$ and 90°, with a reflection angle $\beta 1$ with respect to axis A; A', A" smaller than 60°. In other words:

$$\forall \alpha 1 \in [\alpha p1, 90°]: \beta 1 < 60°.$$

It is noted that FIG. 1C is a simplified schematic drawing, and that the direction of the light ray has been simplified in the sense that the refraction by the lens 120 is not drawn. The first incident angle $\alpha 1$ is the angle of a light ray between the lens 120 and the reflective barrier 210, i.e. a direction of a light ray after it has exited the lens 120. The first predetermined angle $\alpha p1$ may be comprised between 60° and 85°, preferably between 70° and 80°. The reflection angle $\beta 1$ may be comprised between 0° and 50°, preferably between 0° and 45°. At least one reflective barrier of the plurality of reflective barriers 210 may further comprise a second reflective sloping surface 213b opposite the first reflective sloping surface 213a. The second reflective sloping surface 213b may be configured for reflecting light rays emitted through one or more associated second lenses of said plurality of lenses 120 adjacent to the one ore more first lenses associated with the first reflective sloping surface 213a, having a second incident angle $\alpha 2$ with respect to an axis A; A', A" substantially perpendicular to the base surface 211 comprised between a second predetermined angle $\alpha p2$ and 90°, with a second reflection angle $\beta 2$ with respect to said axis A; A', A" smaller than 60°. In other words:

$$\forall \alpha 2 \in [\alpha p2, 90°]: \beta 2 < 60°.$$

The second predetermined angle $\alpha p2$ may be comprised between 60° and 85°, preferably between 70° and 80°. The second reflection angle $\beta 2$ may be comprised between 0° and 50°, preferably between 0° and 45°.

The above-mentioned axis may be a first axis A intersecting said one or more associated first lenses of said plurality of lenses 120 substantially perpendicular to the base surface 211. As illustrated on the left side of FIG. 1C, the first axis A may correspond to the optical axis A of said one or more associated first lenses. The first incident angle al with respect to said first axis A may be between the first predetermined angle $\alpha p1$ and 90°. A second axis A' may be parallel to said first axis A and may intersect the first reflective sloping surface 213a at the reflection point of an incident light ray emitted through said one or more associated first lenses at the first incident angle $\alpha 1$, as illustrated in FIG. 1C. The first reflection angle $\beta 1$ with respect to said second axis A' may be smaller than 60°. Reflected light rays having said first reflection angle $\beta 1$ may intersect said first axis A, as illustrated in FIG. 1C.

Similarly, the above-mentioned axis may be a third axis A intersecting said one or more associated second lenses of said plurality of lenses 120 substantially perpendicular to the base surface 211. As illustrated on the right side of FIG. 1C, the third axis A may correspond to the optical axis A of said one or more associated second lenses. The second incident angle $\alpha 2$ with respect to said third axis A may be between the second predetermined angle $\alpha p2$ and 90°. A fourth axis A" may be parallel to said third axis A and may intersect the second reflective sloping surface 213b at the reflection point of an incident light ray emitted through said one or more associated second lenses at the second incident angle $\alpha 2$. The second reflection angle $\beta 2$ with respect to said fourth axis A" may be smaller than 60°. Reflected light rays having said second reflection angle $\beta 2$ may intersect said third axis A, as illustrated in FIG. 1C.

As illustrated in the embodiment of FIG. 1A, the light emitting device 1 comprises 24 light sources disposed on the carrier 10. Accordingly, the lens plate 100 comprises 24 lenses 120, each lens covering one light source. It is noted that instead of providing one lens plate 100 with twenty four lenses, it is also possible to provide a plurality of lens plates with less lenses, e.g. six lens plates with each four lenses. Each light source may comprise several LEDs. The 24 lenses 120 are aligned into 6 rows R and 4 columns C (6×4) to form a two-dimensional array of lenses 120. However, it should be clear for the skilled person that the number of light sources and/or the number of lenses may vary in other embodiments. It should also be clear for the skilled person that other arrangements of lenses may be envisaged in other embodiments. In a first exemplary embodiment, the lens plate may comprise 4 lenses 120 aligned into 2 rows R and 2 columns C (2×2). In a second exemplary embodiment, the lens plate may comprise 6 lenses 120 aligned into 2 rows R and 3 columns C (2×3), or 3 rows R and 2 columns C (3×2). In yet a third exemplary embodiment, the lens plate may comprise 9 lenses 120 aligned into 3 rows R and 3 columns C (3×3). Many other embodiments may be envisaged, such as (2×4), (3×4) arrangements of lenses, etc. In yet other embodiments, the lens plate may comprise more than 24 lenses.

As illustrated in the embodiment of FIG. 1A, the light shielding structure 200 comprises three light shielding modules 200a, 200b, 200c. Each light shielding module 200a, 200b, 200c comprises ten interconnected reflective barriers 210. Among these ten reflective barriers, six reflective barriers further comprise a second reflective sloping surface 213b opposite the first reflective sloping surface 213a. The four remaining reflective barriers 210 only comprise a first reflective sloping surface 213a, and are located at opposite ends of the flat portion 110 of the lens plate 100. However, it should be clear for the skilled person that the number of reflective barriers 210 of a light shielding module 200a, 200b, 200c, and the number of light shielding modules 200a, 200b, 200c may vary in other embodiments. In a first exemplary embodiment, only one reflective barrier 210 may be present, resulting in a first glare reduction compared to a situation wherein the light emitting device 1 does not comprise any light shielding structure 200. In a second exemplary embodiment, one light shielding module may be present, resulting in a further glare reduction. In a third exemplary embodiment, two light shielding modules may be present, resulting in an even further glare reduction. In the embodiment illustrated in FIG. 1A, three light shielding modules are present, resulting in a highest glare reduction. Note that the above-mentioned different glare reductions may correspond to different G/G* classifications. In non-illustrated embodiments wherein the light shielding structure 200 comprises three light shielding modules 200a, 200b, 200c, the reflective barriers 210 belonging to the central light shielding module 200b may be substantially higher (lower) than the reflective barriers 210 belonging to the two peripheral light shielding modules 200a, 200c. Optionally, the reflective barriers 210 within a light shielding module 200a, 200b, 200c may have different heights. For example, reflective barriers 210 of a given light shielding module 200a, 200b, 200c facing associated lenses 120 located in a central portion of the lens plate 100 may be higher or lower than the reflective barriers 210 of said light shielding module 200a, 200b, 200c facing associated lenses 120 located in a peripheral portion of the lens plate 100. More generally, the reflective barriers 210 facing associated lenses 120 located in a central portion of the lens plate 100 may be substantially higher (lower) than the reflective barriers 210 facing associated lenses 120 located in a peripheral portion of the lens plate 100. In the embodiment of FIG. 1A, 18 of the 30 reflective barriers 210 are disposed between adjacent columns C of lenses 120; 6 reflective barriers between the first column and the second column, 6 reflective barriers between the second column and the third column, and 6 reflective barriers between the third column and the fourth column. The first reflective sloping surface 213a and the second reflective sloping surface 213b of 18 of the 30 reflective barriers 210 may be symmetric with respect to a plane P substantially perpendicular to the flat portion 110 and at equal distance from the one ore more first lenses and the one or more second lenses. In other embodiments, these reflective barriers may be asymmetric with respect to said plane P. In other embodiments, at least one of the 30 reflective barriers 210 may be disposed between two adjacent columns C. More generally, in exemplary embodiments reflective barriers 210 may be provided between some pairs of adjacent columns C, or between all pairs. Moreover, the reflective barriers 210 may be provided along an entire column C, or along only a portion of a column C.

As illustrated in the embodiment of FIG. 1A, the 24 lenses 120 are 24 non-rotational symmetric lenses 120 comprising a symmetry plane Pl substantially perpendicular to the flat portion 110, and substantially parallel to the top edge 212 of the 30 reflective barriers 210. Also an edge of the base surface 211 of the 30 reflective barriers 210 is substantially parallel to said symmetry plane Pl. An edge of the base surface 211 delimiting the second reflective sloping surface 213b of 18 of the 30 reflective barriers 210 is substantially parallel to said symmetry plane Pl. However, it should be clear for the skilled person that in other embodiments at least one lens may be a rotation-symmetric lens, such as a hemispherical lens or an ellipsoidal lens having a major symmetry plane and a minor symmetry plane. In another embodiment, at least one lens may have no symmetry. In yet another embodiment at least one lens may be a free-form lens.

In the embodiment of FIG. 1A, the 4 columns C are formed along the symmetry plane Pl. The first reflective sloping surface 213a of the 30 reflective barriers 210 is facing one associated lens of the 24 lenses 120 belonging to one column of said 4 columns C. The second reflective sloping surface 213b of 18 of the 30 reflective barriers 210 is facing one associated lens of the 24 lenses 120 belonging to the first column or to the fourth column. However, it should be clear for the skilled person that in other embodiments the first reflective sloping surface 213a of the at least one reflective barrier of the plurality of reflective barriers 210 may be facing one or more associated lenses of the plurality of lenses 120 belonging to one column of said plurality of columns C. It should be also clear for the skilled person that in other embodiments the second reflective sloping surface 213b of the at least one reflective barrier of the plurality of reflective barriers 210 may be facing one or more associated lenses of the plurality of lenses 120 belonging to a column which is adjacent to said column.

As illustrated in the embodiment of FIG. 1A, each light shielding module 200a, 200b, 200C further comprises a connecting means 220, preferably disposed on said flat portion 110, between two adjacent rows of the 6 rows R. The connecting means 220 is composed of four connecting portions 221, each connecting portion 211 being configured to connect two reflective barriers 210 arranged at one side of two associated lenses to two other reflective barriers 210 arranged at the other side of said two associated lenses. However, it should be clear for the skilled person that in other embodiments the connecting means 220 may be composed of more or less than four connecting portions 221, depending on the amount of reflective barriers 210 comprised in the light shielding module 200. More generally, a light shielding structure may comprise any number of light shielding modules, and each light shielding module may comprises any number of interconnected reflective barriers.

Figure 6:
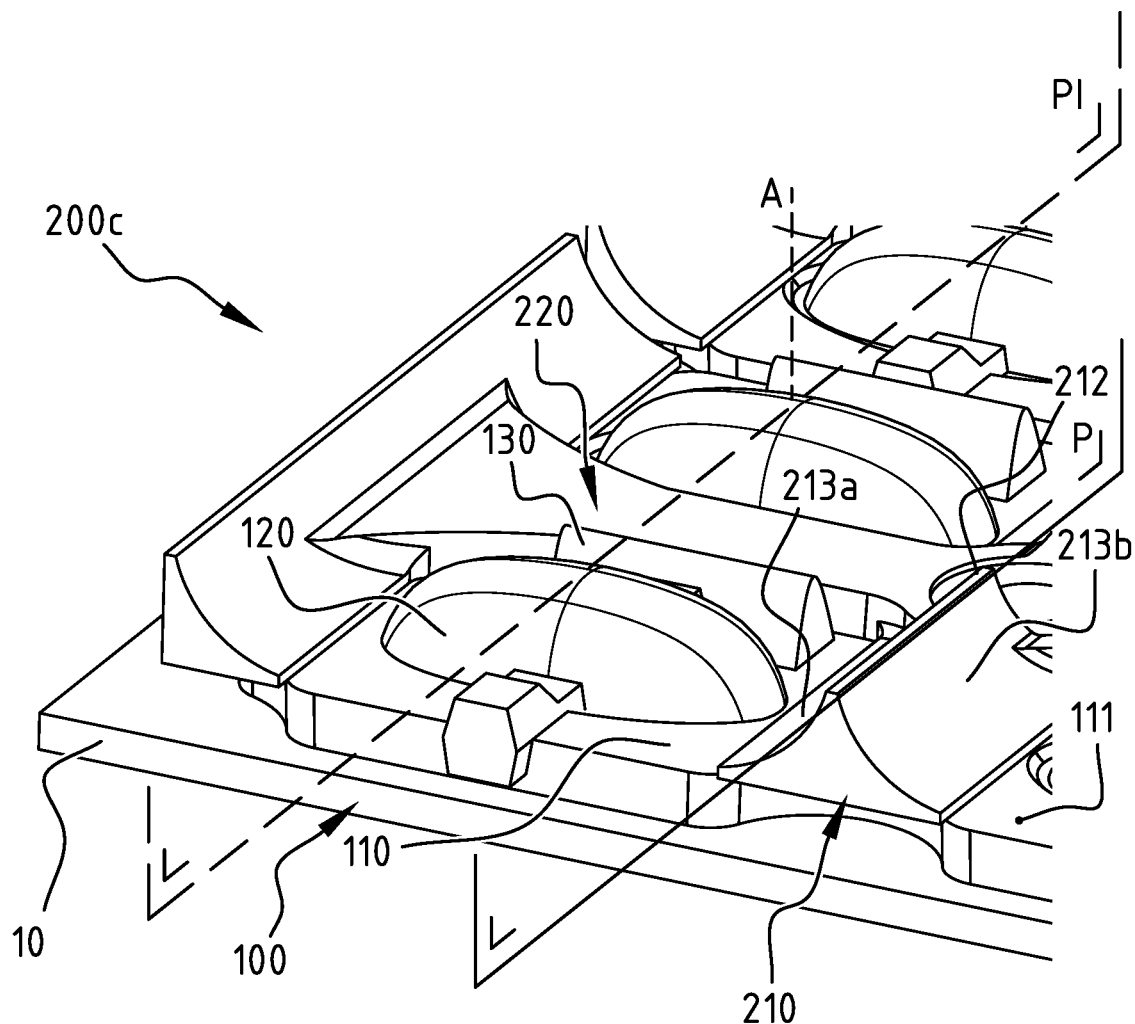
FIG. 6 shows an enlarged perspective view of another exemplary embodiment of a light emitting device.

FIG. 6 shows an enlarged perspective view of another exemplary embodiment of a light emitting device.

In the embodiment illustrated in FIG. 6, the light emitting device 1 comprises a carrier 10, a plurality of light sources (not shown) disposed on the carrier 10, a lens plate 100 disposed on the carrier 10, and a light shielding structure 200 mounted on said lens plate 100. The lens plate 100 comprises a flat portion 110 and a plurality of lenses 120 covering the plurality of light sources. As in FIGS. 1A-1C, the plurality of lenses 120 may be non-rotational symmetric lenses comprising a symmetry plane Pl. The light shielding structure 200 comprises the same features as described in FIGS. 1A-1C. Alternatively or additionally to lenses 120, the lens plate 100 may comprise other optical elements, such as reflectors, backlights, prisms, collimators, diffusors, and the like. As illustrated in FIG. 6, the lens plate 100 further comprises a plurality of backlight elements 130. A backlight element of the plurality of backlight elements 130 is associated with each lens of the plurality of lenses 120, and is arranged substantially perpendicular to the symmetry plane Pl. In other embodiments, backlight elements 130 may be associated with only a subset of the plurality of lenses 120. Those one or more other optical elements, such as backlight elements 130, may be formed integrally with the lens plate. In other embodiments, those one or more other optical elements may be formed integrally with the light shielding structure, and/or mounted on the lens plate and/or on the light shielding structure via releasable fastening elements. Optionally, the lens plate 100 is provided with holes for fixation to the carrier 10. The carrier 10 may comprise a printed circuit board (PCB).

As shown in FIG. 1C, a lens 120 of the plurality of lenses 120 may comprise a lens portion having an outer surface and an inner surface facing the associated light source. The outer surface may be a convex surface and the inner surface may be a concave or planar surface. In other non-illustrated variants, a lens may comprise multiple lens portions adjoined in a discontinuous manner, wherein each lens portion may have a convex outer surface and a concave inner surface.

Figure 2A:
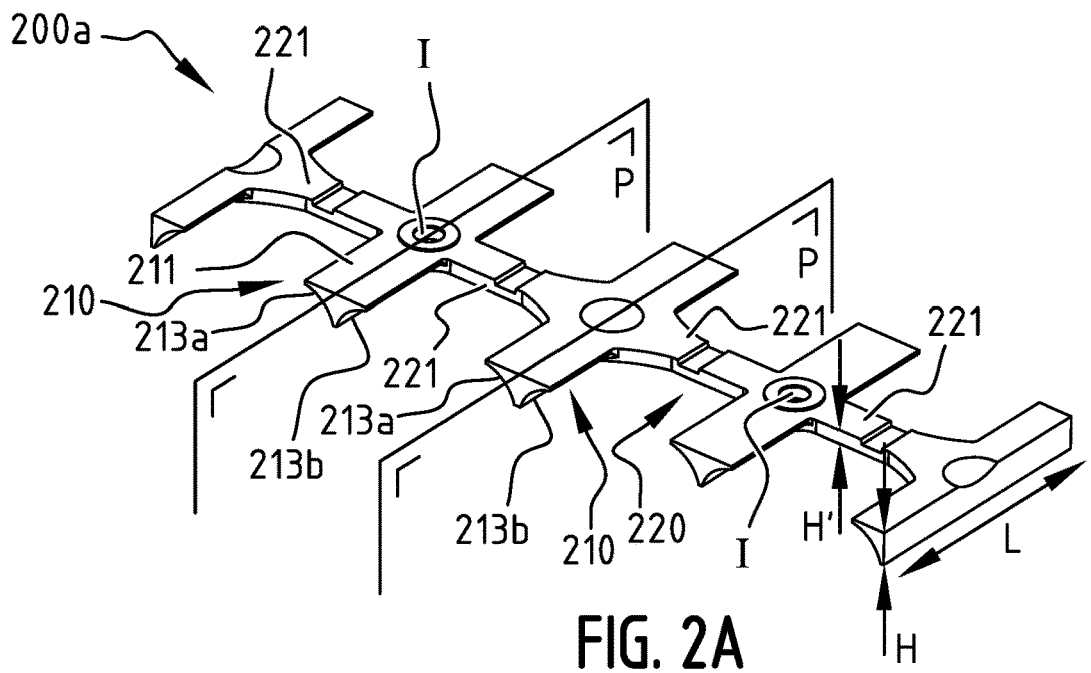
FIGS. 2A-2C respectively show a perspective view of an exemplary embodiment of a light shielding module for use in a light emitting device, a longitudinal view thereof, and a top view thereof.
Figure 2B:
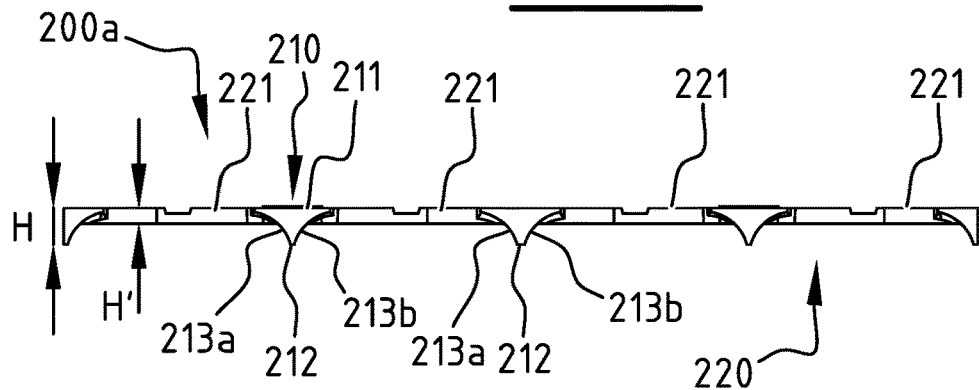
Figure 2C:
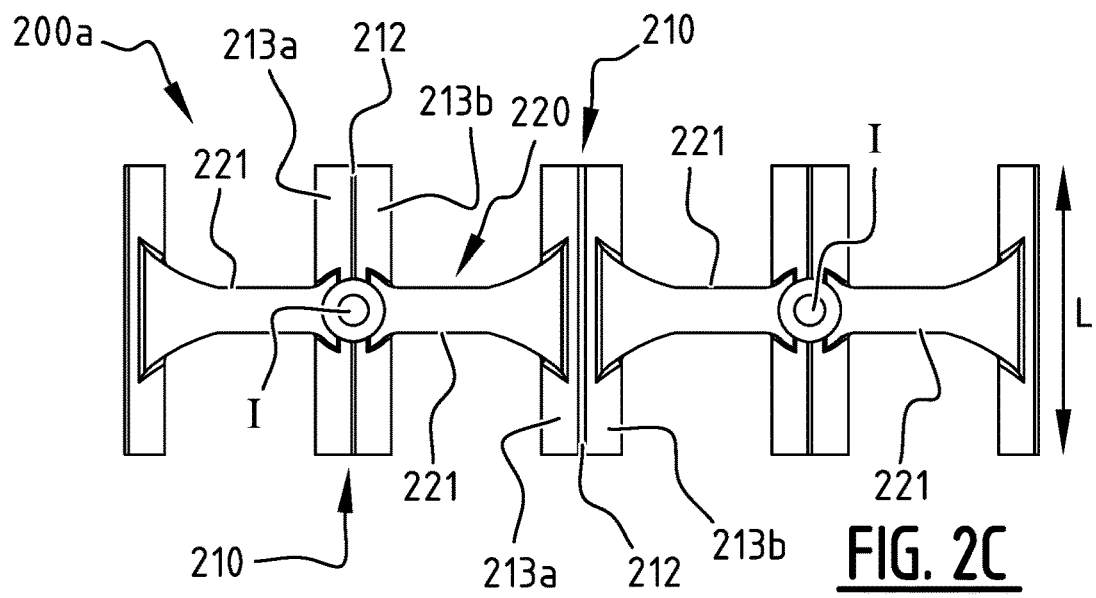

FIGS. 2A-2C respectively show a perspective view of an exemplary embodiment of a light shielding module for use in a light emitting device, a longitudinal view thereof, and a top view thereof.

As illustrated in the embodiments of FIGS. 2A-2C, the light shielding module 200a for use in a light emitting device (not shown) comprises a plurality of reflective barriers 210, each comprising a base surface 211, a top edge 212 at a height H above said base surface 211, and a first reflective sloping surface 213a connecting the base surface 211 and the top edge 212 and facing one or more associated lenses of said plurality of lenses (not shown). Said first reflective sloping surface 213a is configured for reflecting light rays emitted through one or more associated first lenses of said plurality of lenses having a first incident angle with respect to an axis (not shown, see FIG. 1C) substantially perpendicular to the base surface 211 comprised between a first predetermined angle and 90°, with a first reflection angle with respect to said axis smaller than 60°. The first predetermined angle may be comprised between 60° and 85°, preferably between 70° and 80°. The first reflection angle may be comprised between 0° and 50°, preferably between 0° and 45°. At least one reflective barrier of the plurality of reflective barriers 210 may further comprise a second reflective sloping surface 213b opposite the first reflective sloping surface 213a. The second reflective sloping surface 213b may be configured for reflecting light rays emitted through one or more associated second lenses of said plurality of lenses (not shown) adjacent to the one ore more first lenses associated with the first reflective sloping surface 213a, having a second incident angle with respect to an axis (not shown, see FIG. 1C) substantially perpendicular to the base surface 211 comprised between a second predetermined angle and 90°, with a second reflection angle with respect to said axis smaller than 60°. The second predetermined angle may be comprised between 60° and 85°, preferably between 70° and 80°. The second reflection angle may be comprised between 0° and 50°, preferably between 0° and 45°.

In the embodiments illustrated in FIGS. 2A and 2C, the light shielding module 200a comprises 10 reflective barriers 210. However, it should be clear for the skilled person that the number of reflective barriers 210 may vary in other embodiments. Among these 10 reflective barriers, 6 reflective barriers further comprise a second reflective sloping surface 213b opposite the first reflective sloping surface 213a. The first reflective sloping surface 213a and the second reflective sloping surface 213b of 6 of the 10 reflective barriers 210 may be symmetric with respect to a plane P. In other embodiments, these reflective surfaces 213a, 213b may be asymmetric with respect to said plane P.

As illustrated in the embodiments of FIGS. 2A-2C, the light shielding module 200a further comprises a connecting means 220. The connecting means 220 is composed of 4 connecting portions 221, each connecting portion being configured to connect two reflective barriers 210 to two adjacent reflective barriers 210. However, it should be clear for the skilled person that in other embodiments the connecting means 220 may be composed of more or less than 4 connecting portions 221, depending on the amount of reflective barriers 210 comprised in the light shielding module 200a.

The material of the light shielding structure 200 may comprise plastic. Preferably, the plastic used for manufacturing the light shielding structure 200 is a white and opaque plastic, but plastic of a different color and/or partially translucent plastic may be envisaged. The light shielding structure 200 may also comprise other materials than plastic. The light shielding structure 200 may be covered with white painting or with painting of a different color, or with a reflective coating. In an embodiment, a surface roughness of the first reflective sloping surface 213a may correspond to any one of a coarse surface finish, a polished surface finish, or a combination thereof. The surface roughness may be the same for the first reflective sloping surface 213a of each reflective barrier 210, or may be different from one reflective barrier 210 to another. Similarly, a surface roughness of the second reflective sloping surface 213b may correspond to any one of a coarse surface finish, a polished surface finish, or a combination thereof. The surface roughness may be the same for the second reflective sloping surface 213b of each reflective barrier 210, or may be different from one reflective barrier 210 to another. In different embodiments, the first reflective sloping surface 213a and the second reflective sloping surface 213b may present a different surface roughness.

Figure 5:
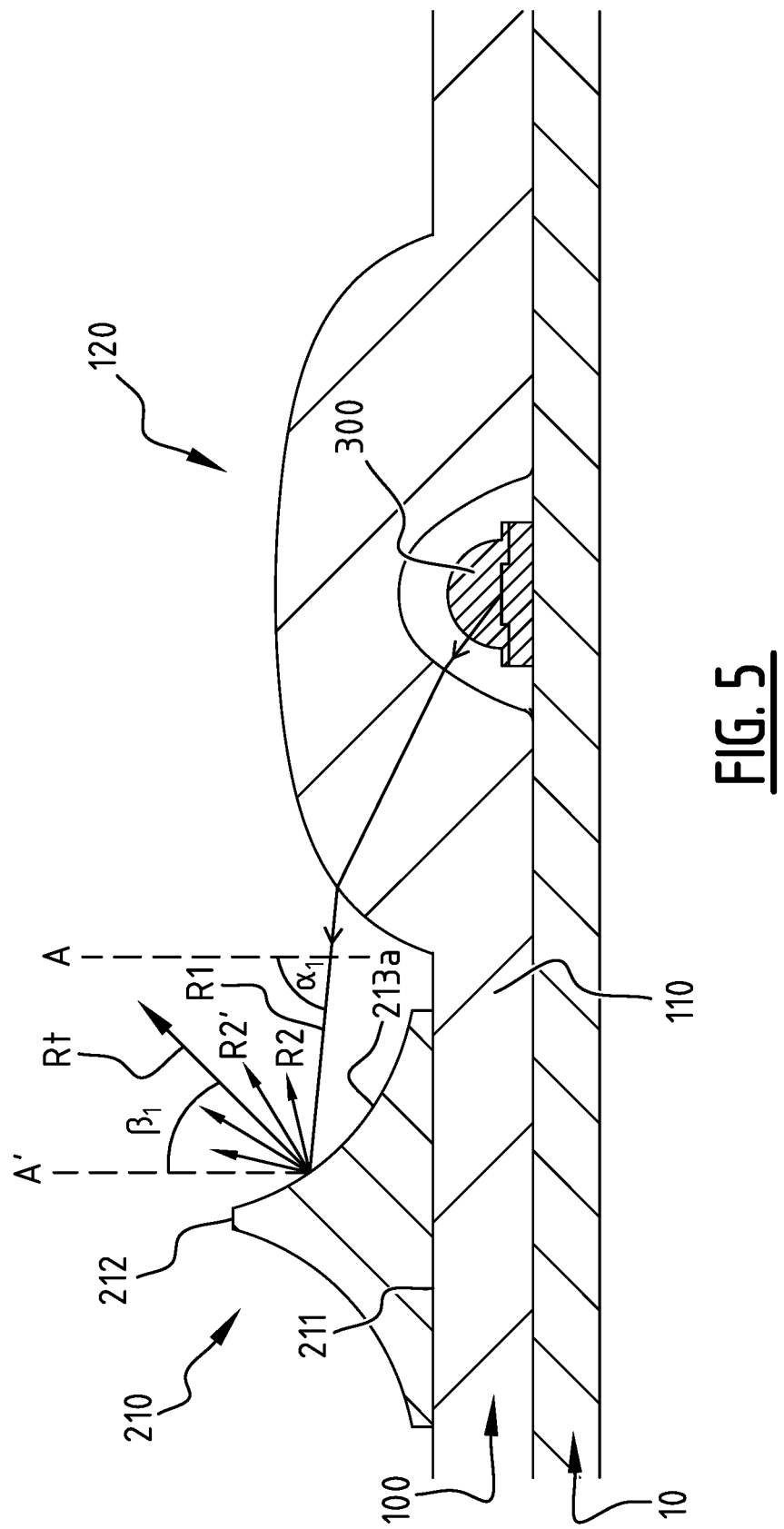
FIG. 5 illustrates schematically the incident and reflected light rays in another exemplary embodiment.

FIG. 5 illustrates schematically the incident and reflected light rays in another exemplary embodiment.

In the embodiment illustrated in FIG. 5, the first reflective sloping surface 213a is configured to reflect an incident light ray R1 exiting a lens 120 arranged over a light source 300, as a light beam with multiple reflected light rays R2, R2', etc. The main reflection direction of the reflected light rays R2, R2', etc., defined as the direction of highest intensity, is represented by the light ray Rt in FIG. 5. The light ray R1 has a first incident angle $\alpha 1$ with respect to an axis A, A' substantially perpendicular to the flat portion 110 of the lens plate 100. The first reflective sloping surface 213a is configured such that for angles $\alpha 1$ between a first predetermined angle and 90°, the light ray Rt has a reflection angle $\beta 1$ with respect to said axis A, A' smaller than 60°. The first predetermined angle, and the other angles may have the same values as defined above.

In the embodiments illustrated in FIGS. 2A-2C, the plurality of reflective barriers 210 and the connecting means 220 are integrally formed. In other embodiments, the plurality of reflective barriers 210 may be formed in one ore more first pieces, and the connecting means 220 may be formed in one ore more second pieces independently from the one ore more first pieces. The light shielding structure 200 may be mounted on the lens plate (not shown) by means of releasable fastening elements. Said releasable fastening elements may comprise any one or more than the following elements: screws, locks, clamps, clips, or a combination thereof. For example, screws may extend through holes in the light shielding structure 200 and through corresponding holes in the lens plate 100. The releasable fastening elements may be located at intersections I of the plurality of reflective barriers 210 with the connecting means 220. For example, the holes and associated screws may be provided at the intersections I of the plurality of reflective barriers 210 with the connecting means 220. It should be noted that the height H of the plurality of reflective barriers 210 may be substantially larger than a height H' of the connecting means 220. In another embodiment, a hole or channel may be arranged in the lens plate, into which the light shielding structure 200 may be clipped or slid. In yet another embodiment, the light shielding structure 200 may be integrally formed with the lens plate.

FIGS. 3A-3H schematically illustrate eight exemplary embodiments corresponding to eight exemplary shapes of a reflective sloping surface of a light shielding structure for use in a light emitting device.

As illustrated in the embodiments of FIGS. 3A-3H, the first reflective sloping surface 213a may comprise any one of a concave surface, a convex surface, a flat surface, or a combination thereof. Similarly, the second reflective sloping surface 213b may comprise any one of a concave surface, a convex surface, a flat surface, or a combination thereof. The surfaces comprised in the first reflective sloping surface 213a and in the second reflective sloping surface 213b are configured for reflecting light rays emitted through one or more associated first lenses of said plurality of lenses having an incident angle with respect to an axis substantially perpendicular to the lens plate/base surface comprised between a first or second predetermined angle and 90°, with a first or second reflection angle with respect to said axis smaller than 60°. The first or second predetermined angle may be comprised between 60° and 85°, preferably between 70° and 80°. The first or second reflection angle may be comprised between 0° and 50°, preferably between 0° and 45°.

Figures 3A, 3B, 3C, 3D, 3E, 3F, 3G, 3H:
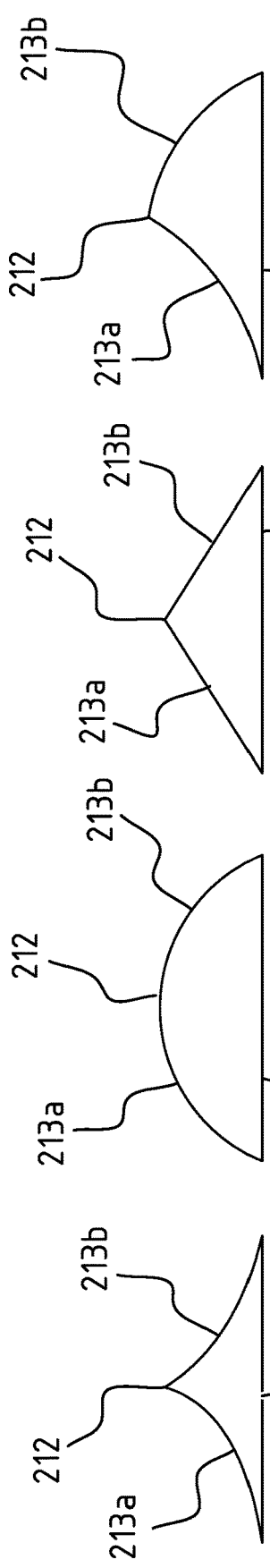
FIGS. 3A-3H schematically illustrate eight exemplary embodiments corresponding to eight exemplary shapes of a reflective sloping surface of a light shielding structure for use in a light emitting device.

FIGS. 3A-3C respectively display a first reflective sloping surface 213a and a second reflective sloping surface 213b having a concave surface, a convex surface, and a flat surface. The flat surface may be inclined, i.e., substantially not perpendicular to the flat portion of the lens plate (not shown), in order to avoid reflecting backward incident light ray having a large incident angle with a reflection angle substantially equal to the incident angle.

FIGS. 3D-3F respectively display a first reflective sloping surface 213a having a concave surface, a convex surface, and a flat surface, and a second reflective sloping surface 213b having a convex surface, a flat surface, and a concave surface. Similarly, the flat surface may be inclined.

FIG. 3G displays a first reflective sloping surface 213a having a convex surface, and a second reflective sloping surface 213b having a convex surface. The height of the reflective barrier is substantially larger than a width of the base surface 211. In the embodiment of FIG. 3G, the height of the reflective barrier may be larger than a height of a lens, preferably larger than 110% of said height. Preferably, the height of the reflective barrier is smaller than 10 mm, more preferably smaller than 8 mm, most preferably smaller than 7 mm, or even smaller than 6 mm. In other embodiments wherein the height of the reflective barrier is substantially larger than a width of the base surface, the first reflective sloping surface 213a and the second reflective sloping 213b surface may each comprise two flat surfaces, as illustrated in FIG. 3H. The two flat surfaces may be inclined. The two flat surfaces may be at an angle with respect to each other. In other words, the two flat surfaces may define a discontinuous flat surface having a straight line connecting the two flat surfaces. The first or second reflection angle is smaller than 60°, and may be comprised between 0° and 50°, preferably between 0° and 45°.

It should be clear for the skilled person that embodiments illustrating other combinations of surfaces comprised in the first reflective sloping surface 213a and in the second reflective sloping surface 213b may be envisaged. In an exemplary embodiment, the first reflective sloping surface 213a and/or the second reflective sloping surface 213b may comprise a combination of a concave surface and a convex surface, or a combination of a convex surface and a flat surface, or a combination of a flat surface and a concave surface.

The first reflective sloping surface 213a and/or the second reflective sloping surface 213b may be covered with white painting or with painting of a different color, or with a reflective coating. In an embodiment, a surface roughness of the first reflective sloping surface 213a may correspond to any one of a coarse surface finish, a polished surface finish, or a combination thereof. Similarly, a surface roughness of the second reflective sloping surface 213b may correspond to any one of a coarse surface finish, a polished surface finish, or a combination thereof.

Figure 4:
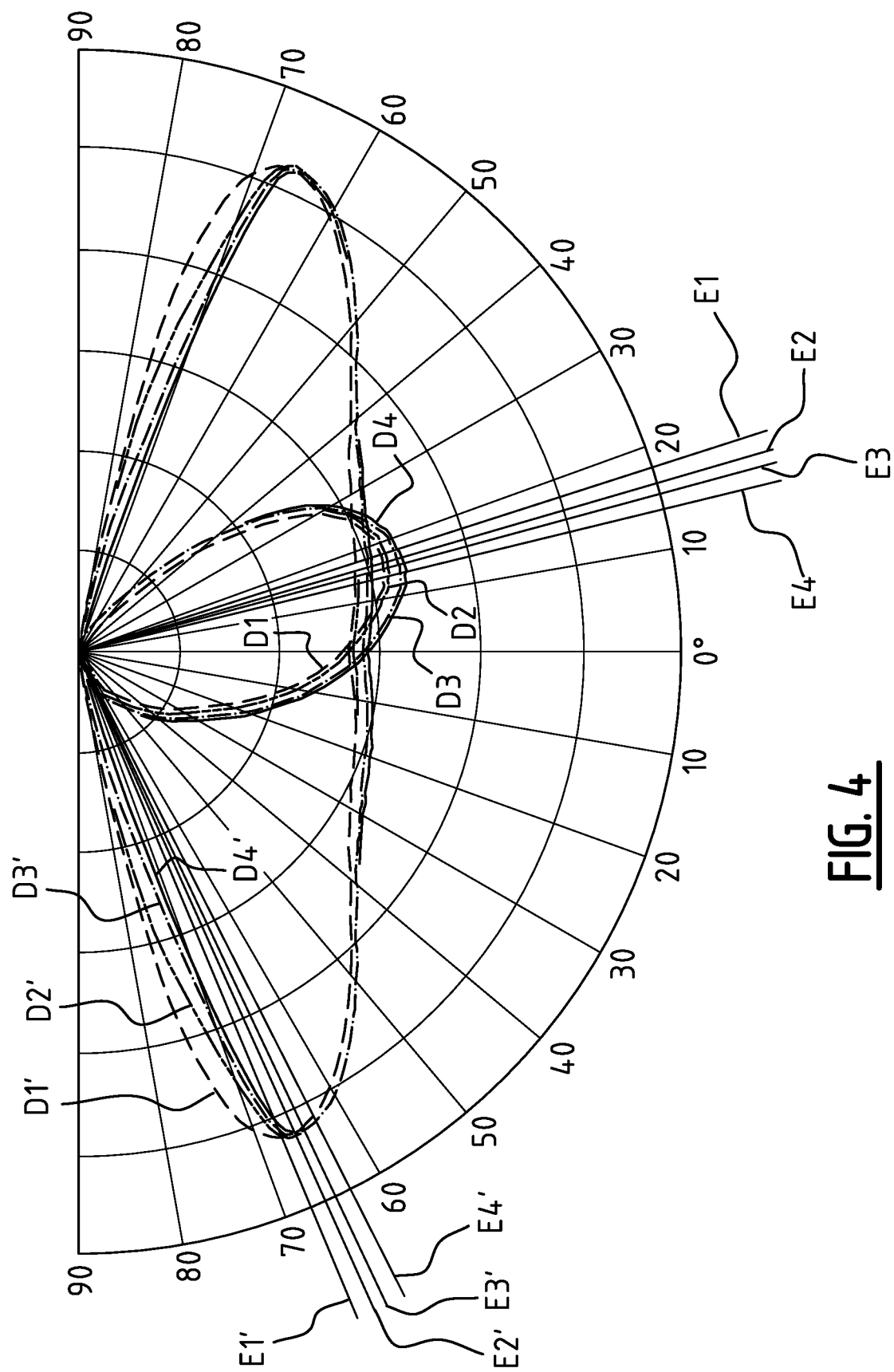
FIG. 4 illustrates a polar diagram of the light distribution according to different embodiments of a light shielding structure for use in a light emitting device.

FIG. 4 illustrates a polar diagram of the light distribution according to different embodiments of a light shielding structure for use in a light emitting device.

Four embodiments of light distribution are considered in relation with FIG. 4, wherein the number of reflective barriers 210 comprised in the light shielding structure 200 varies from one embodiment to another. In the first embodiment, no reflective barrier 210 is present. In the second embodiment, 10 reflective barriers 210 are present. In the third embodiment, 20 reflective barriers 210 are present. In the fourth embodiment, which corresponds to the embodiment illustrated in FIG. 1A, 30 reflective barriers 210 are present.

The resulting change in light distribution from one embodiment to another is illustrated in FIG. 4. On the polar diagram, D1, D2, D3, and D4 respectively show the light distribution at 90°-270°, i.e., in the symmetry plane Pl of FIGS. 1A-1B in the first embodiment, the second embodiment, the third embodiment, and the fourth embodiment. D1', D2', D3', and D4' respectively show the light distribution at 0°-180°, i.e., in a plane perpendicular to the lens plate 100 and to the symmetry plane Pl of FIGS. 1A-1B in the first embodiment, the second embodiment, the third embodiment, and the fourth embodiment.

It can be clearly seen that the shape of the light beam is changed from one embodiment to another. The directions E1, E2, E3, and E4 respectively correspond to a maximum of the light distribution at 90°-270° in the first embodiment, the second embodiment, the third embodiment, and the fourth embodiment. The directions E1', E2', E3', and E4' respectively correspond to a maximum of the light distribution at 0°-180° in the first embodiment, the second embodiment, the third embodiment, and the fourth embodiment. In both 90°-270° and 0°-180° light distribution cases, it is observed that the maximal light intensity decreases from the first embodiment to the fourth embodiment. It is also observed that the angle corresponding to said maximum also decreases from the first embodiment to the fourth embodiment. Finally, it is observed that the light intensity at large angles that may correspond to glaring angles also decreases from the first embodiment to the fourth embodiment.

Hence, by varying the number of reflective barriers 210 comprised in the light shielding structure 200 as illustrated in FIG. 4, the shape of the light beam can be changed and adapted in function of the G/G* classification that needs to be obtained. For example, the first embodiment may correspond to a G3/G*3 classification, whereas the second, third, and fourth embodiments may correspond to a G4/G*4 classification.

Figure 7:
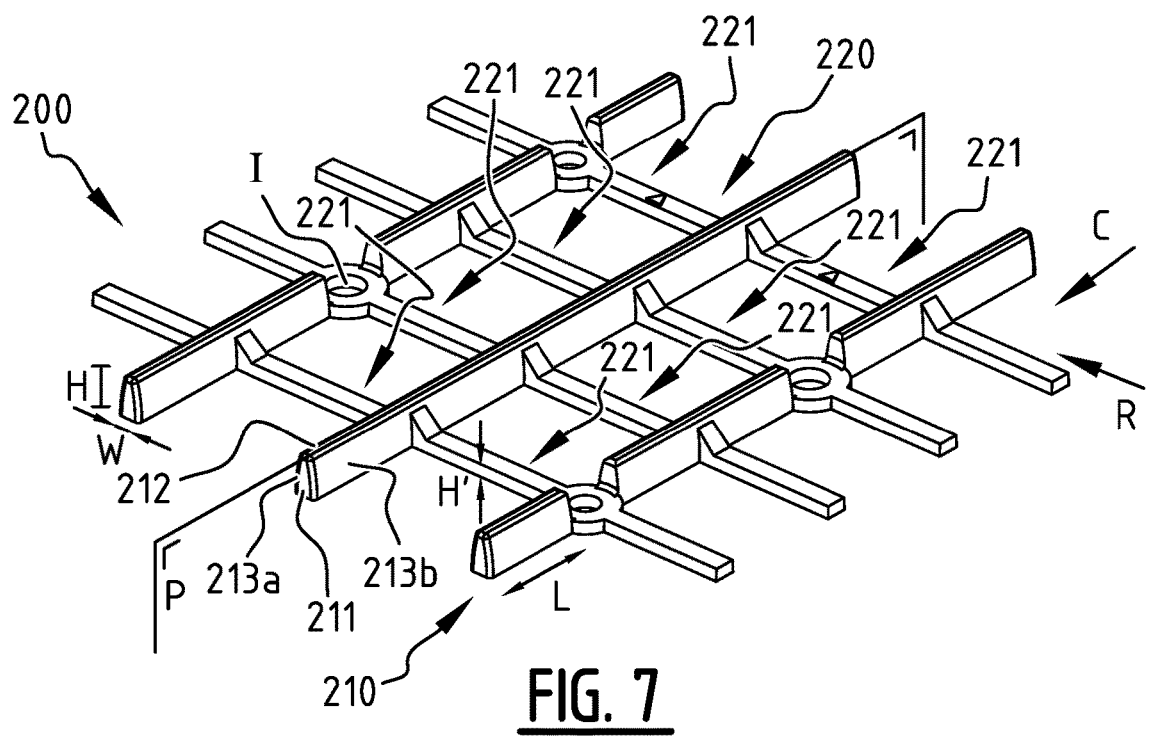
FIG. 7 shows a perspective view of another exemplary embodiment of a light shielding structure for use in a light emitting device.
Figure 8:
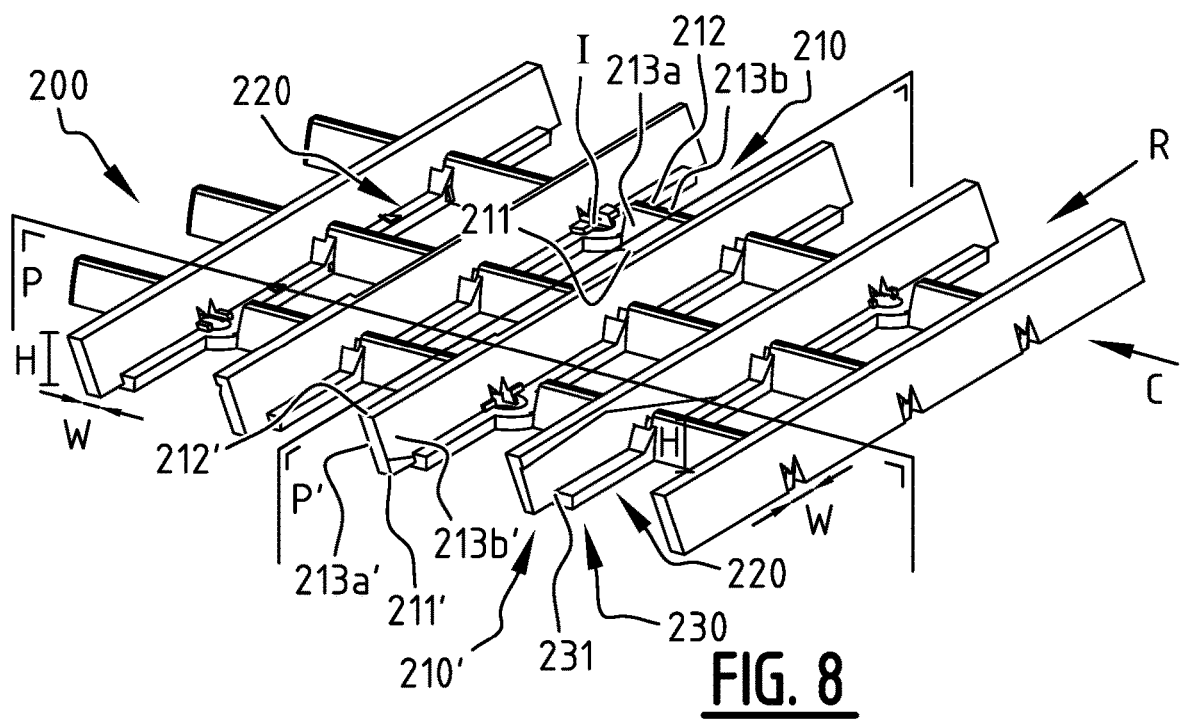
FIG. 8 shows a perspective view of yet another exemplary embodiment of a light shielding structure for use in a light emitting device.
Figure 9A:
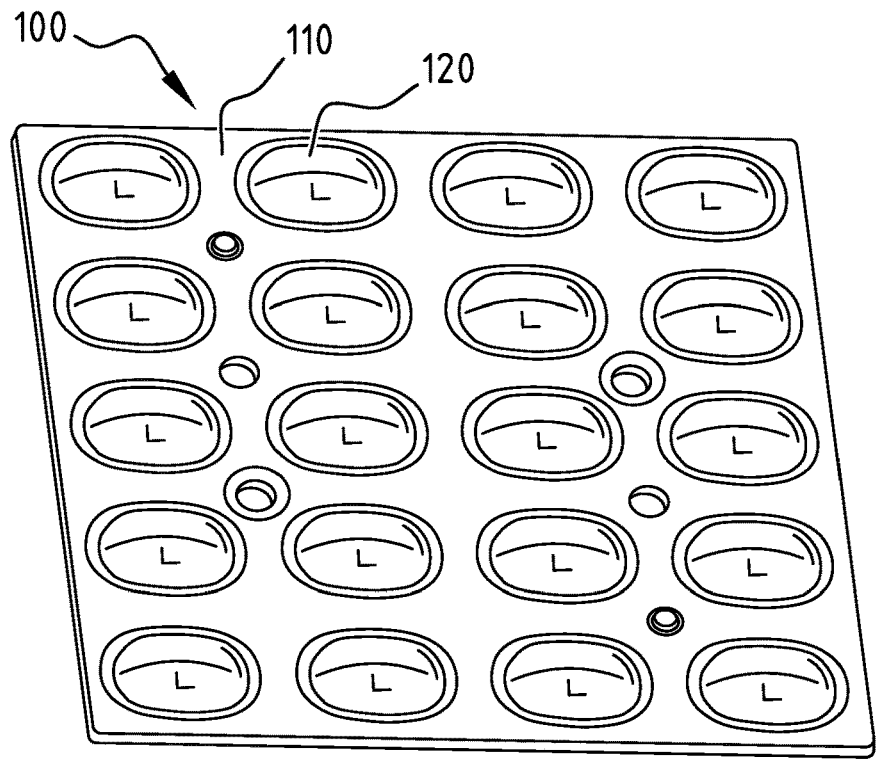
FIGS. 9A-9D respectively show a perspective view of four exemplary embodiments of a light emitting device.
Figure 9B:
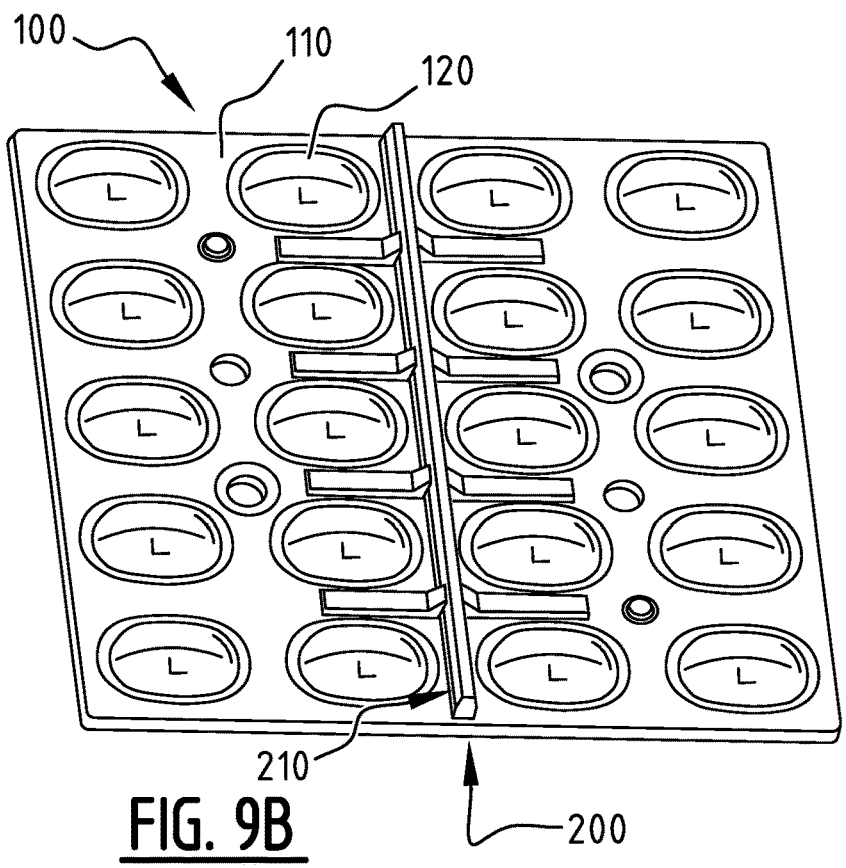
Figure 9C:
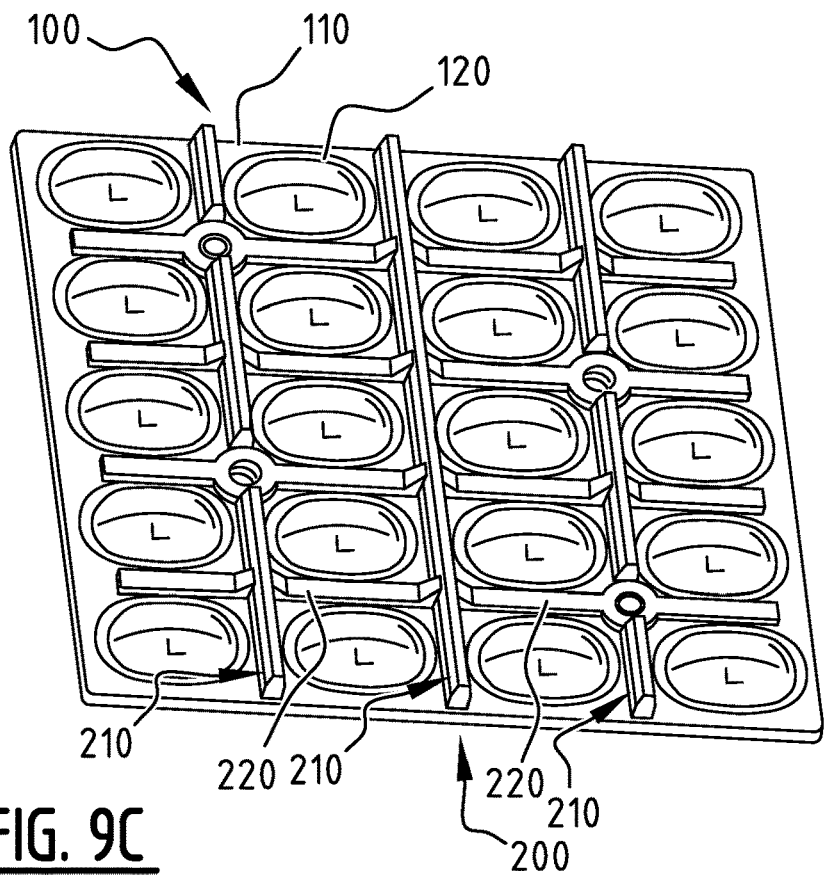
Figure 9D:
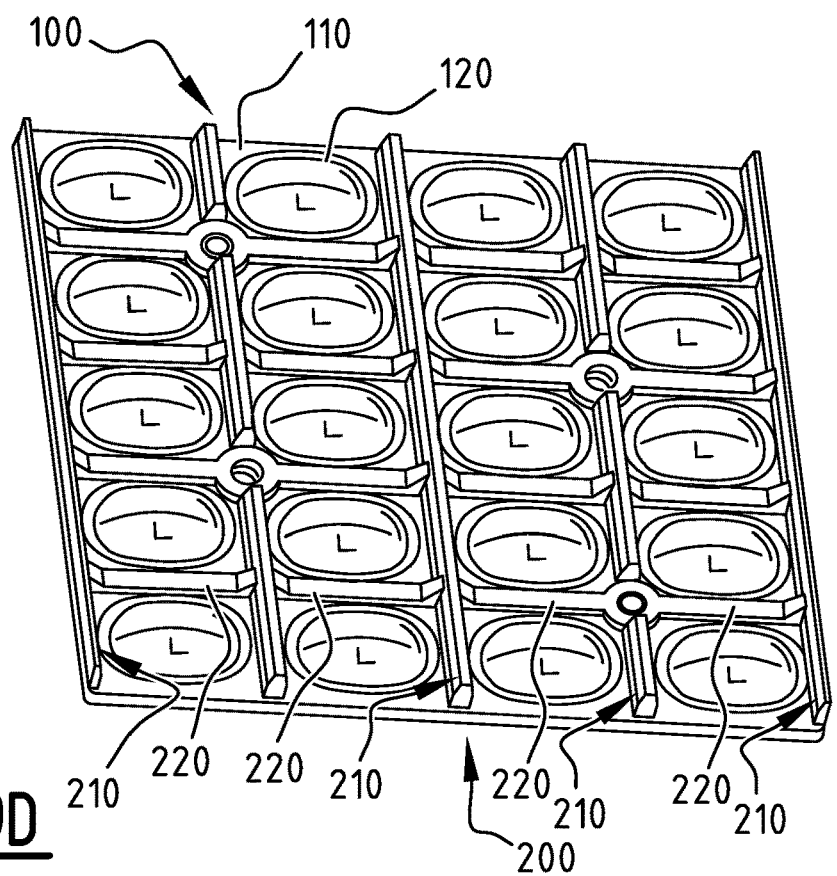

FIG. 7 shows a perspective view of another exemplary embodiment of a light shielding structure for use in a light emitting device. FIG. 8 shows a perspective view of yet another exemplary embodiment of a light shielding structure for use in a light emitting device.

In the embodiments of FIGS. 7 and 8, the light shielding structure 200 for use in a light emitting device (not shown) comprises a plurality of reflective barriers 210, each comprising a base surface 211, a top edge 212 at a height H above said base surface 211, and a first reflective sloping surface 213a connecting the base surface 211 and the top edge 212 and facing one or more associated lenses of said plurality of lenses (not shown). Said first reflective sloping surface 213a is configured for reflecting light rays emitted through one or more associated first lenses of said plurality of lenses having a first incident angle with respect to an axis (not shown, see FIG. 1C) substantially perpendicular to the base surface 211 comprised between a first predetermined angle and 90°, with a first reflection angle with respect to said axis smaller than 60°. The first predetermined angle may be comprised between 60° and 85°, preferably between 70° and 80°. The first reflection angle may be comprised between 0° and 50°, preferably between 0° and 45°. At least one reflective barrier of the plurality of reflective barriers 210 may further comprise a second reflective sloping surface 213b opposite the first reflective sloping surface 213a. The second reflective sloping surface 213b may be configured for reflecting light rays emitted through one or more associated second lenses of said plurality of lenses (not shown) adjacent to the one ore more first lenses associated with the first reflective sloping surface 213a, having a second incident angle with respect to an axis (not shown, see FIG. 1C) substantially perpendicular to the base surface 211 comprised between a second predetermined angle and 90°, with a second reflection angle with respect to said axis smaller than 60°. The second predetermined angle may be comprised between 60° and 85°, preferably between 70° and 80°. The second reflection angle may be comprised between 0° and 50°, preferably between 0° and 45°.

In contrast to the embodiments of FIGS. 2A-2C, in the embodiments of FIGS. 7 and 8 the height H of the plurality of reflective barriers 210 is substantially larger than a width W of the base surface 211. In the embodiments of FIGS. 7 and 8, the height H of the plurality of reflective barriers 210 may be larger than a height of the plurality of lenses (not shown), preferably larger than 110% of said height. Preferably, the height H of the plurality of reflective barriers 210 is smaller than 10 mm, more preferably smaller than 8 mm, most preferably smaller than 7 mm, or even smaller than 6 mm. In the embodiments of FIGS. 7 and 8, the first reflective sloping surface 213a and the second reflective sloping surface 213b comprise a convex surface. In other embodiments, the first reflective sloping surface 213a and the second reflective sloping surface 213b may comprise two flat surfaces. The two flat surfaces may be inclined.

In the embodiments of FIGS. 7 and 8, the light shielding structure 200 comprises 15 reflective barriers 210. These 15 reflective barriers further comprise a second reflective sloping surface 213b opposite the first reflective sloping surface 213a. The first reflective sloping surface 213a and the second reflective sloping surface 213b of the 15 reflective barriers 210 are symmetric with respect to a plane P. The light shielding structure 200 further comprises a connecting means 220. The connecting means 220 is composed of 8 connecting portions 221, each connecting portion 221 being configured to connect 2 reflective barriers 210 to 2 adjacent reflective barriers 210.

In the embodiments of FIGS. 7 and 8, the plurality of reflective barriers 210 and the connecting means 220 are integrally formed. In other embodiments, the plurality of reflective barriers 210 may be formed in one ore more first pieces, and the connecting means 220 may be formed in one ore more second pieces independently from the one ore more first pieces. The light shielding structure 200 may be mounted on the lens plate (not shown) by means of releasable fastening elements. Said releasable fastening elements may comprise any one or more of the following elements: screws, locks, clamps, clips, or a combination thereof. For example, screws may extend through holes in the light shielding structure 200 and through corresponding holes in the lens plate 100. The releasable fastening elements may be located at intersections I of the plurality of reflective barriers 210 with the connecting means 220. It should be noted that the height H of the plurality of reflective barriers 210 may be substantially larger than a height H' of the connecting means 220. In another embodiment, a hole or channel may be arranged in the lens plate, into which the light shielding structure may be clipped or slid. In yet another embodiment, the light shielding structure may be integrally formed with the lens plate.

In the embodiment of FIG. 8, the light shielding structure 200 comprises 5 further reflective barriers 210' arranged at an angle with respect to the flat portion (not shown) and substantially perpendicular to the 15 reflective barriers 210. In other embodiments, the further reflective barriers 210' may be arranged substantially perpendicular to the flat portion. In yet other embodiments, the further reflective barriers 210' may be arranged at an angle with respect to the reflective barriers 210. More generally, a plurality of reflective barriers 210 and a plurality of further reflective barriers 210' arranged at an angle with respect to said plurality of reflective barriers 210 may form a two-dimensional array of reflective barriers 210, 210' that cooperates with the two-dimensional array formed by the plurality of rows and columns of lenses. The two-dimensional array of reflective barriers 210, 210' may comprise at least two parallel reflective barriers 210 and at least two parallel further reflective barriers 210' arranged at an angle with respect to the at least two parallel reflective barriers 210. A pattern created by said two-dimensional array of reflective barriers 210, 210'may be composed of at least one square or rectangle if the at least two parallel further reflective barriers 210' are arranged perpendicular to the at least two parallel reflective barriers 210, or may be composed of at least one lozenge or parallelogram otherwise.

In the embodiment of FIG. 8, the 5 further reflective barriers 210' are disposed between two adjacent rows R of lenses 120. The 5 further reflective barriers comprise a first reflective sloping surface 213a' and a second reflective sloping surface 213b' opposite the first reflective sloping surface 213a'. The first reflective sloping surface 213a' and the second reflective sloping surface 213b' of the 5 further reflective barriers 210' are two inclined flat surfaces. The first reflective sloping surface 213a' and the second reflective sloping surface 213b' of the 5 further reflective barriers 210' are not symmetric with respect to a plane P'.

In the embodiment of FIG. 8, the connecting means 220 comprises 5 elongated carrier slats 230, each comprising an elongated channel 231 for receiving a further reflective barrier of the 5 further reflective barrier 210'. Each of the 5 further reflective barriers 210' may be slid into a corresponding elongated channel 231. To that end, the base surface 211' of the 5 further reflective barriers 210' may be provided with one or more protrusions, e.g. one or more pins and/or ribs, which fit in the associated elongated channel 231. In other embodiments, one or more protrusions, such as pins or ribs, may be provided to the connecting means, said one or more protrusions being configured for cooperating with complementary features of at least one further reflective barrier in order to secure the at least one further reflective barrier to the connecting means.

In another non-illustrated embodiment, one or more recesses, such as one or more holes and/or notches, may be arranged in the light shielding structure, into which the plurality of reflective barriers may be clipped, or vice versa. To that end, the base surface of the plurality of reflective barriers may be provided with one or more protrusions, e.g. one or more pins and/or ribs, which fit in the one or more recesses. For example, the one or more notches may have a V-shape or a U-shape, and the one or more protrusions may have a triangular or a circular shape which respectively fits in the V-shape or in the U-shape of the one or more notches. The one or more recesses may be provided to the connecting means. In addition or alternatively, one or more protrusions, such as pins or ribs, may be provided to the connecting means, said one or more protrusions being configured for cooperating with complementary features of the plurality of reflective barriers in order to secure the plurality of reflective barriers to the connecting means.

FIGS. 9A-9D respectively show a perspective view of four exemplary embodiments of a light emitting device.

As illustrated in FIGS. 9A-9D, the shape and configuration of the plurality of reflective barriers 210 and of the connecting means 220 correspond to the embodiment of FIG. 7. The number of reflective barriers 210 comprised in the light shielding structure 200 varies from one embodiment of FIGS. 9A-9D to another. In the first embodiment, illustrated in FIG. 9A, no reflective barrier 210 is present. In the second embodiment, illustrated in FIG. 9B, 5 reflective barriers 210 are present. In the third embodiment, illustrated in FIG. 9C, which corresponds to the embodiment illustrated in FIG. 7, 15 reflective barriers 210 are present. In the fourth embodiment, illustrated in FIG. 9D, 25 reflective barriers 210 are present.

Figure 10:
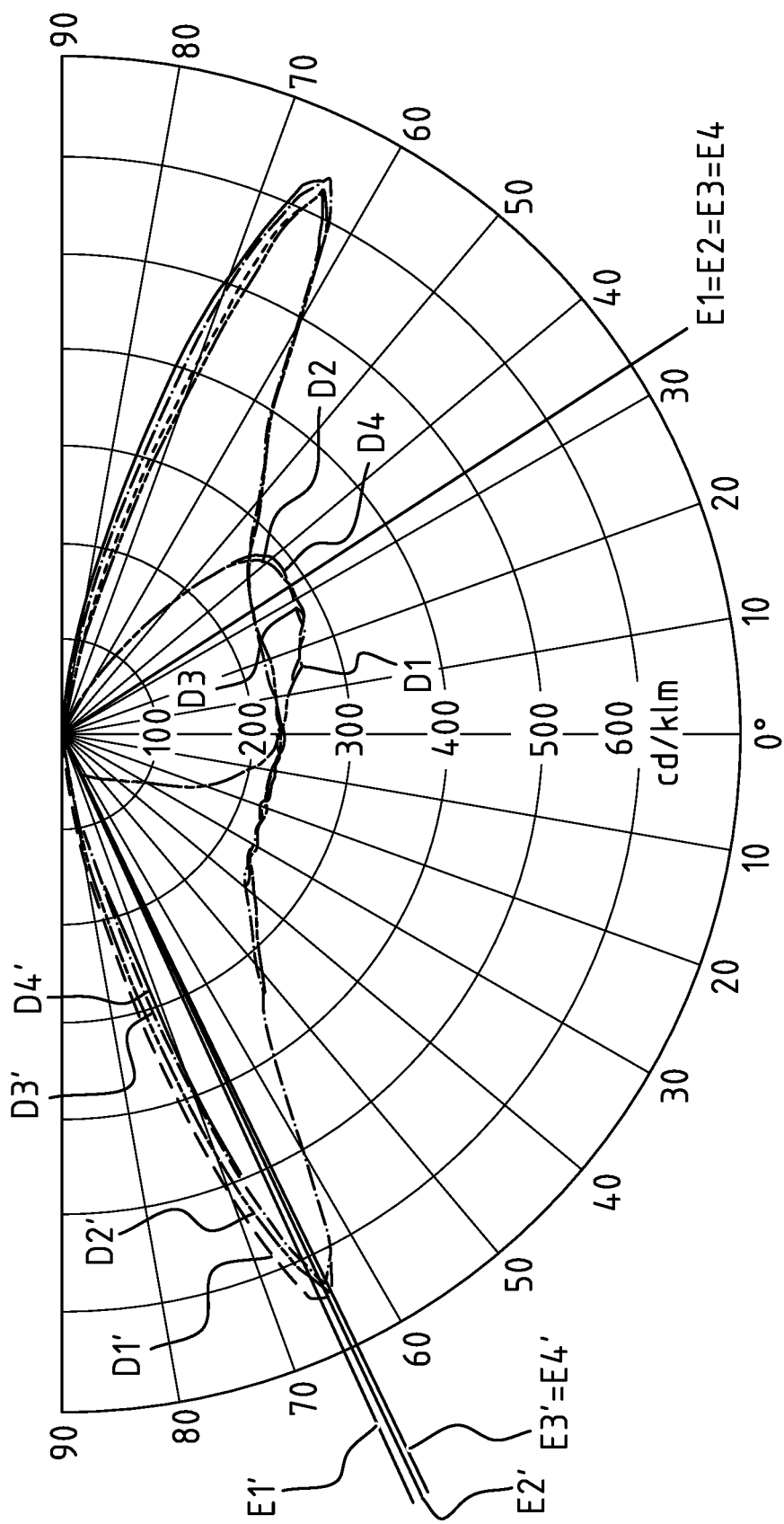
FIG. 10 illustrates a polar diagram of the light distribution according to different embodiments of a light shielding structure for use in a light emitting device.

FIG. 10 illustrates a polar diagram of the light distribution according to different embodiments of a light shielding structure for use in a light emitting device.

Four embodiments of light distribution are considered in relation with FIG. 10, wherein the number of reflective barriers 210 comprised in the light shielding structure 200 varies from one embodiment to another. The first embodiment corresponds to the embodiment of FIG. 9A. The second embodiment corresponds to the embodiment of FIG. 9B. The third embodiment corresponds to the embodiment of FIG. 9C. The fourth embodiment corresponds to the embodiment of FIG. 9D.

The resulting change in light distribution from one embodiment to another is illustrated in FIG. 10. On the polar diagram, D1, D2, D3, and D4 respectively show the light distribution at 90°-270°, i.e., in the symmetry plane Pl of FIGS. 1A-1B, in the first embodiment, the second embodiment, the third embodiment, and the fourth embodiment. D1', D2', D3', and D4' respectively show the light distribution at 0°-180°, i.e., in a plane perpendicular to the lens plate 100 and to the symmetry plane Pl of FIGS. 1A-1B, in the first embodiment, the second embodiment, the third embodiment, and the fourth embodiment.

It can be clearly seen that the shape of the light beam is changed from one embodiment to another. The directions E1, E2, E3, and E4 respectively correspond to a maximum of the light distribution at 90°-270° in the first embodiment, the second embodiment, the third embodiment, and the fourth embodiment. The directions E1', E2', E3', and E4' respectively correspond to a maximum of the light distribution at 0°-180° in the first embodiment, the second embodiment, the third embodiment, and the fourth embodiment. In the 0°-180° light distribution case, it is observed that the maximal light intensity decreases from the first embodiment to the fourth embodiment. It is also observed that the angle corresponding to said maximum also decreases from the first embodiment to the fourth embodiment. Finally, it is observed that the light intensity at large angles that may correspond to glaring angles also decreases from the first embodiment to the fourth embodiment. In the 90°-270° light distribution case, it is observed that the maximal light intensity is kept constant from the first embodiment to the fourth embodiment. It is also observed that the angle corresponding to said maximum is also kept constant from the first embodiment to the fourth embodiment.

Hence, by varying the number of reflective barriers 210 comprised in the light shielding structure 200 as illustrated in FIG. 10, the shape of the light beam can be changed and adapted in function of the G/G* classification that needs to be obtained. For example, the first embodiment may correspond to a G3/G*3 classification, whereas the second, third, and fourth embodiments may correspond to a G4/G*4 classification.

Whilst the principles of the invention have been set out above in connection with specific embodiments, it is to be understood that this description is merely made by way of example and not as a limitation of the scope of protection which is determined by the appended claims.

The invention claimed is:
1. A light emitting device comprising:
a carrier;
a plurality of light sources disposed on the carrier;
a lens plate disposed on the carrier, comprising a flat portion and a plurality of lenses covering the plurality of light sources; and
a light shielding structure comprising a plurality of reflective barriers, each comprising a base surface disposed on said flat portion, a top edge at a height above said base surface, and a first reflective sloping surface connecting the base surface and the top edge and facing one or more associated lenses of said plurality of lenses,
wherein said first reflective sloping surface is configured for reflecting light rays emitted through one or more associated first lenses of said plurality of lenses having a first incident angle α1 with respect to an axis substantially perpendicular to the base surface between a first predetermined angle αp1 and 90°, with a first reflection angle β1 with respect to said axis smaller than 60°.

2. The light emitting device according to claim 1, wherein the first predetermined angle $\alpha p1$ is comprised between 60° and 85°.

3. The light emitting device according to claim 1, wherein the first reflection angle $\beta 1$ is between 0° and 50°.

4. The light emitting device according to claim 1,
wherein the first reflective sloping surface comprises a concave surface, a convex surface, a flat surface, or a combination thereof, and/or
wherein a surface roughness of the first reflective sloping surface corresponds to any one of a coarse surface finish, a polished surface finish, or a combination thereof.

5. The light emitting device according to claim 1, wherein the plurality of lenses is a plurality of non-rotation symmetric lenses comprising a symmetry plane substantially perpendicular to the flat portion, and substantially parallel to the top edge of the plurality of reflective barriers.

6. The light emitting device according to claim 1, wherein at least one reflective barrier of the plurality of reflective barriers further comprises a second reflective sloping surface opposite the first reflective sloping surface, configured for reflecting light rays emitted through one or more associated second lenses of said plurality of lenses adjacent to the one or more first lenses associated with the first reflective sloping surface, having a second incident angle $\alpha 2$ with respect to an axis substantially perpendicular to the base surface between a second predetermined angle $\alpha p2$ and 90°, with a second reflection angle $\beta 2$ with respect to said axis smaller than 60°.

7. The light emitting device according to claim 6, wherein an edge of the base surface delimiting the second reflective sloping surface is substantially parallel to said symmetry plane.

8. The light emitting device according to claim 6,
wherein said second reflective sloping surface comprises a concave surface, a convex surface, a flat surface, or a combination thereof, and/or
wherein a surface roughness of the second reflective sloping surface corresponds to a coarse surface finish, a polished surface finish, or a combination thereof, and/or
wherein the first reflective sloping surface and the second reflective sloping surface of the at least one of the plurality of reflective barriers are symmetric with respect to a plane substantially perpendicular to the flat portion.

9. The light emitting device according to claim 1, wherein the light shielding structure comprises at least one further reflective barrier arranged at an angle with respect to the flat portion and at an angle with respect to the plurality of reflective barriers.

10. The light emitting device according to claim 1,
wherein the plurality of lenses is aligned into a plurality of rows and a plurality of columns to form a two-dimensional array, and
wherein at least one reflective barrier of the plurality of reflective barriers is disposed between two adjacent columns.

11. The light emitting device according to claim 9, wherein the at least one further reflective barrier is disposed between two adjacent rows.

12. The light emitting device according to claim 10, wherein said plurality of columns is formed along the symmetry plane.

13. The light emitting device according to claim 10,
wherein the first reflective sloping surface of the at least one reflective barrier of the plurality of reflective barriers is facing one or more associated lenses of the plurality of lenses belonging to one column of said plurality of columns, and
wherein the second reflective sloping surface of the at least one reflective barrier of the plurality of reflective barriers is facing one or more associated lenses of the plurality of lenses belonging to a column which is adjacent to said column.

14. The light emitting device according to claim 10, wherein the light shielding structure further comprises a connecting means configured for connecting the plurality of reflective barriers.

15. The light emitting device according to claim 14, wherein the connecting means is disposed between two adjacent rows of said plurality of rows, and/or
wherein the connecting means comprises one or more notches or channels into which the plurality of reflective barriers is received, and/or
wherein the plurality of reflective barriers and the connecting means are integrally formed, and/or
wherein the height of the plurality of reflective barriers is substantially larger than a height of the connecting means.

16. The light emitting device according to claim 14, wherein the connecting means comprises at least one elongated carrier slat, said at least one elongated carrier slat comprising an elongated channel configured for receiving a reflective barrier of the at least one further reflective barrier.

17. The light emitting device according to claim 1, wherein the height of the plurality of reflective barriers is between 30% and 150% of a height of the plurality of lenses, and/or
wherein the height of the plurality of reflective barriers is larger than a height of the plurality of lenses, and/or
wherein the height of the plurality of reflective barriers is substantially larger than a width of the base surface.

18. The light emitting device according to claim 1, wherein the light shielding structure is mounted on the lens plate by means of releasable fastening elements,
wherein preferably the releasable fastening elements comprise screws, locks, clamps, clips, or a combination thereof, and/or
wherein preferably the releasable fastening elements are located at intersections of the plurality of reflective barriers with the connecting means.

19. The light emitting device according to claim 1, wherein the lens plate is disposed on the carrier by screwing, locking, clamping, clipping, gluing, or a combination thereof, and/or
wherein the plurality of light sources comprise light emitting diodes (LEDs), and/or
wherein the plurality of lenses comprises free-form lenses, and/or
wherein the light shielding structure is mounted on said lens plate, or
wherein the light shielding structure and the lens plate are in one piece, and/or
wherein a material of the light shielding structure comprises plastic.

20. A light shielding structure for use in a light emitting device according to claim 1, said light shielding structure comprising a plurality of reflective barriers, each comprising a base surface, a top edge at a height above said base surface, and a first reflective sloping surface connecting the base surface and the top edge,
   wherein said first reflective sloping surface is configured for reflecting light rays emitted at a first incident angle $\alpha 1$ with respect to an axis substantially perpendicular to the base surface between a first predetermined angle $\alpha p1$ and $90°$, with a first reflection angle $\beta 1$ with respect to said axis smaller than $60°$.

* * * * *